United States Patent
Chen et al.

(10) Patent No.: US 11,228,394 B2
(45) Date of Patent: Jan. 18, 2022

(54) POLAR CODING TECHNIQUES FOR BLIND DETECTION OF DIFFERENT PAYLOAD SIZES

(71) Applicants: Kai Chen, Shenzhen (CN); Changlong Xu, Beijing (CN); Jing Jiang, San Diego, CA (US); Gabi Sarkis, San Diego, CA (US); Hao Xu, Beijing (CN); Qualcomm Incorporated, San Diego, CA (US)

(72) Inventors: Kai Chen, Shenzhen (CN); Changlong Xu, Beijing (CN); Jing Jiang, San Diego, CA (US); Gabi Sarkis, San Diego, CA (US); Hao Xu, Beijing (CN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/765,066

(22) PCT Filed: Sep. 24, 2018

(86) PCT No.: PCT/CN2018/107179
§ 371 (c)(1),
(2) Date: May 18, 2020

(87) PCT Pub. No.: WO2019/095853
PCT Pub. Date: May 23, 2019

(65) Prior Publication Data
US 2020/0358555 A1 Nov. 12, 2020

(30) Foreign Application Priority Data
Nov. 17, 2017 (WO) ................ PCT/CN2017/111600

(51) Int. Cl.
*H04L 1/00* (2006.01)
*H03M 13/45* (2006.01)

(52) U.S. Cl.
CPC .......... *H04L 1/0042* (2013.01); *H03M 13/45* (2013.01); *H04L 1/0054* (2013.01); *H04L 1/0061* (2013.01)

(58) Field of Classification Search
CPC ... H04L 1/0057; H04L 1/0042; H04L 1/0054; H04L 1/0061; H03M 13/45
See application file for complete search history.

(56) References Cited

U.S. PATENT DOCUMENTS

2016/0013810 A1   1/2016   Gross et al.
2017/0222754 A1   8/2017   Noh et al.
(Continued)

FOREIGN PATENT DOCUMENTS

CN   106998208 A   8/2017
CN   107124188 A   9/2017
(Continued)

OTHER PUBLICATIONS

Intel: "Considerations in Polar code design", 3GPP TSG RAN WG1 Ad hoc R1-1700385 Jan. 20, 2017, 4 pages.
(Continued)

*Primary Examiner* — Sung S Ahn
(74) *Attorney, Agent, or Firm* — Holland & Hart LLP

(57) ABSTRACT

Methods, systems, and devices for wireless communications are described. In some systems, wireless devices may encode and decode transmissions using polar codes. A transmitting device may encode a payload based on a selected payload size. For example, the transmitting device may construct a bit vector including payload bits, parity bits, frozen bits, or some combination of these, and may modify the bits or the order of the bits based on the selected payload size. The device may generate a polar-encoded codeword based on this bit vector, and may transmit the polar-encoded codeword to a receiving device. The receiving device may
(Continued)

blind decode the polar-encoded codeword, and may determine the correct payload size based on the decoded bit vector. For example, the device may perform decoding or may check decoded bits based on a payload size hypothesis, where the decoding may fail for any incorrect payload size hypothesis.

46 Claims, 19 Drawing Sheets

(56) References Cited

U.S. PATENT DOCUMENTS

| | | | |
|---|---|---|---|
| 2017/0366199 A1* | 12/2017 | Ge | G06F 11/1004 |
| 2018/0324764 A1* | 11/2018 | Bendlin | H04W 28/065 |
| 2020/0259588 A1* | 8/2020 | Iyer | H04L 5/0048 |

FOREIGN PATENT DOCUMENTS

| | | |
|---|---|---|
| CN | 107342843 A | 11/2017 |
| EP | 2360866 A1 | 8/2011 |
| WO | WO-2017117489 A1 | 7/2017 |
| WO | WO-2017127973 A1 | 8/2017 |
| WO | WO-2017176302 A1 | 10/2017 |

OTHER PUBLICATIONS

International Search Report and Written Opinion—PCT/CN2017/111600—ISA/EPO—dated Jun. 28, 2018.
International Search Report and Written Opinion—PCT/CN2018/107179 ISA/EPO—dated Dec. 26, 2018.
Qualcomm Incorporated: "Consideration of UE ID scrambling for DCI", 3GPP TSG-RAN WG1 #90-Bis R1-1718586, Oct. 13, 2017, 8 pages.
Spreadtrum Communications: "RNTI scrambling for PDCCH Polar code", 3GPP TSG RAN WG1 Meeting 90bis, R1-1717752, Oct. 13, 2017, 3 pages.
Coherent Logix Inc: "Scrambling Sequence Design for Early Block Discrimination on DCI Blind Detection", 3GPP Draft, R1-1711571, 3GPP TSG RAN1-NR#2, Scrambling Sequence Design For Early Block Discrimination on DCI Blind Detection, 3rd Generation Partnership Project (3GPP), Mobile Competence Centre, 650, Route Des Lucioles, vol. Ran WG1, No. Qingdao, Jun. 27, 2017-Jun. 30, 2017, Jun. 26, 2017 (Jun. 26, 2017), XP051300753, pp. 1-6, Retrieved from the Internet: URL:http://www.3gpp.org/ftp/Meetings_3GPP_SYNC/RAN1/Docs/ [retrieved on Jun. 26, 2017] the whole document.
Research in Motion, et al., "CSI Reporting During SCell Activation/Deactivation", 3GPP Draft, 3GPP TSG RAN WG1 Meeting #65, R1-111664_CQI_Activation_Final, 3rd Generation Partnership Project (3GPP), Mobile Competence Centre, 650, Route Des Lucioles, F-06921 Sophia-Antipolis Cedex, France, vol. RAN WG1, RAN WG1, No. Barcelona, Spain, May 9, 2011, May 3, 2011 (May 3, 2011), XP050491291, pp. 1-3, [retrieved on May 3, 2011] the Whole Document.
Supplementary European Search Report—EP18879462—Search Authority—Munich—dated Jul. 2, 2021.

* cited by examiner

POLAR CODING TECHNIQUES FOR BLIND DETECTION OF DIFFERENT PAYLOAD SIZES

CROSS REFERENCES

The present Application is a 371 national phase of International Patent Application No. PCT/CN2018/107179 by Qualcomm Incorporated et al., entitled "POLAR CODING TECHNIQUES FOR BLIND DETECTION OF DIFFERENT PAYLOAD SIZES," filed Sep. 24, 2018, which claims priority to International Patent Application No. PCT/CN2017/111600 by Qualcomm Incorporated et al., entitled "POLAR CODING TECHNIQUES FOR BLIND DETECTION OF DIFFERENT PAYLOAD SIZES," filed Nov. 17, 2017, each of which is assigned to the assignee hereof and expressly incorporated by reference herein in its entirety.

BACKGROUND

The following relates generally to wireless communication, and more specifically to polar coding techniques for blind detection of different payload sizes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform-spread-orthogonal frequency-division multiplexing (OFDM) (DFT-S-OFDM). A wireless multiple-access communications system may include a number of base stations or network access nodes, each simultaneously supporting communication for multiple communication devices, which may be otherwise known as user equipment (UE).

In some wireless communications systems, wireless devices may implement error-correcting codes, such as polar codes, to encode and decode transmissions. A wireless device may transmit using multiple different codeword configurations, including the size of a payload encoded within the codeword, when implementing polar codes. However, encoding certain specific payloads of different sizes may result in identical codewords for transmission. In these cases, a wireless device receiving one of these codewords may not be able to accurately determine the payload or payload size, as the received codeword could map to multiple different payloads and corresponding payload sizes.

SUMMARY

The described techniques relate to improved methods, systems, devices, or apparatuses that support polar coding techniques for blind detection of different payload sizes. Generally, the described techniques provide for encoding and decoding codewords using polar codes, where the codewords indicate a payload size. A wireless device may select a payload (e.g., a set of payload bits) for transmission, and may encode the payload based on the size of the payload. For example, the transmitting device may construct a bit vector including payload bits, parity bits, frozen bits, or some combination of these bits, and may modify the bits or the order of the bits in the bit vector based on the selected payload size. The device may generate a codeword based on this bit vector and a polar code and may transmit the codeword to a receiving device. The receiving device may not know the payload size of the received codeword and may perform a blind decoding process to determine the correct payload size. For example, the device may perform decoding or may check decoded bits for the codeword based on a payload size hypothesis, where the decoding process may fail for any incorrect payload size hypothesis. When a payload size hypothesis results in a decoded bit vector that passes the parity checks, the device may determine that the hypothesized payload size is correct, and may parse the payload bits from the decoded bit vector to determine the transmitted information.

A method of wireless communications is described. The method may include identifying a plurality of payload bits of a payload for encoding, determining a bit vector comprising the plurality of payload bits, wherein at least one bit or a bit order of the bit vector is based at least in part on a size of the payload, generating a polar-encoded codeword based at least in part on the bit vector, and transmitting the polar-encoded codeword.

An apparatus for wireless communications is described. The apparatus may include means for identifying a plurality of payload bits of a payload for encoding, means for determining a bit vector comprising the plurality of payload bits, wherein at least one bit or a bit order of the bit vector is based at least in part on a size of the payload, means for generating a polar-encoded codeword based at least in part on the bit vector, and means for transmitting the polar-encoded codeword.

Another apparatus for wireless communications is described. The apparatus may include a processor, memory in electronic communication with the processor, and instructions stored in the memory. The instructions may be operable to cause the processor to identify a plurality of payload bits of a payload for encoding, determine a bit vector comprising the plurality of payload bits, wherein at least one bit or a bit order of the bit vector is based at least in part on a size of the payload, generate a polar-encoded codeword based at least in part on the bit vector, and transmit the polar-encoded codeword.

A non-transitory computer-readable medium for wireless communications is described. The non-transitory computer-readable medium may include instructions operable to cause a processor to identify a plurality of payload bits of a payload for encoding, determine a bit vector comprising the plurality of payload bits, wherein at least one bit or a bit order of the bit vector is based at least in part on a size of the payload, generate a polar-encoded codeword based at least in part on the bit vector, and transmit the polar-encoded codeword.

Some examples of the method, apparatus, and non-transitory computer-readable medium described above may further include processes, features, means, or instructions for determining a masking vector corresponding to the size of the payload. Some examples of the method, apparatus, and non-transitory computer-readable medium described above may further include processes, features, means, or instructions for scrambling the plurality of payload bits, a plurality of parity bits associated with the plurality of payload bits, a plurality of frozen bits, or a combination thereof with the masking vector.

In some examples of the method, apparatus, and non-transitory computer-readable medium described above, scrambling the plurality of payload bits, the plurality of parity bits, the plurality of frozen bits, or the combination thereof with the masking vector comprises an exclusive or (XOR) operation.

In some examples of the method, apparatus, and non-transitory computer-readable medium described above, the bit vector comprises the plurality of payload bits and a plurality of parity bits associated with the plurality of payload bits. In some examples of the method, apparatus, and non-transitory computer-readable medium described above, determining the bit vector comprises positioning at least one bit of the plurality of parity bits in a lowest index of the bit vector, wherein the plurality of payload bits may be positioned in higher indices of the bit vector.

In some examples of the method, apparatus, and non-transitory computer-readable medium described above, generating the polar-encoded codeword comprises assigning the plurality of payload bits and the plurality of parity bits to a plurality of information bit channels of a polar code, wherein the at least one bit of the plurality of parity bits may be assigned to a least reliable channel of the plurality of information bit channels.

Some examples of the method, apparatus, and non-transitory computer-readable medium described above may further include processes, features, means, or instructions for applying a parity function to the plurality of payload bits to generate the plurality of parity bits. In some examples of the method, apparatus, and non-transitory computer-readable medium described above, the plurality of parity bits comprises a plurality of cyclic redundancy check (CRC) bits.

In some examples of the method, apparatus, and non-transitory computer-readable medium described above, determining the bit vector comprises appending an initial bit to the bit vector, wherein the initial bit comprises an opposite bit value to a default frozen bit value. In some examples of the method, apparatus, and non-transitory computer-readable medium described above, the initial bit indicates a message type associated with the payload.

In some examples of the method, apparatus, and non-transitory computer-readable medium described above, determining the bit vector comprises arranging the plurality of payload bits, a plurality of parity bits associated with the plurality of payload bits, a plurality of frozen bits, or a combination thereof so that an initial bit of the bit vector comprises an opposite bit value to a default frozen bit value.

A method of wireless communications is described. The method may include receiving a polar-encoded codeword, the polar-encoded codeword generated based at least in part on a bit vector comprising a plurality of payload bits of a payload, and performing a blind decoding process on the polar-encoded codeword, the blind decoding process comprising: determining a size of the payload based at least in part on at least one log-likelihood ratio (LLR) associated with the bit vector; decoding the polar-encoded codeword to obtain the bit vector based at least in part on the determined size of the payload; and parsing the bit vector to obtain the plurality of payload bits based at least in part on the determined size of the payload.

An apparatus for wireless communications is described. The apparatus may include means for receiving a polar-encoded codeword, the polar-encoded codeword generated based at least in part on a bit vector comprising a plurality of payload bits of a payload, and means for performing a blind decoding process on the polar-encoded codeword, the blind decoding process comprising: means for determining a size of the payload based at least in part on at least one LLR associated with the bit vector; means for decoding the polar-encoded codeword to obtain the bit vector based at least in part on the determined size of the payload; and means for parsing the bit vector to obtain the plurality of payload bits based at least in part on the determined size of the payload.

Another apparatus for wireless communications is described. The apparatus may include a processor, memory in electronic communication with the processor, and instructions stored in the memory. The instructions may be operable to cause the processor to receive a polar-encoded codeword, the polar-encoded codeword generated based at least in part on a bit vector comprising a plurality of payload bits of a payload, and perform a blind decoding process on the polar-encoded codeword, the instructions for the blind decoding process comprising further instructions operable to cause the processor to: determine a size of the payload based at least in part on at least one LLR associated with the bit vector; decode the polar-encoded codeword to obtain the bit vector based at least in part on the determined size of the payload; and parse the bit vector to obtain the plurality of payload bits based at least in part on the determined size of the payload.

A non-transitory computer-readable medium for wireless communications is described. The non-transitory computer-readable medium may include instructions operable to cause a processor to receive a polar-encoded codeword, the polar-encoded codeword generated based at least in part on a bit vector comprising a plurality of payload bits of a payload, and perform a blind decoding process on the polar-encoded codeword, the instructions for the blind decoding process comprising further instructions operable to cause the processor to: determine a size of the payload based at least in part on at least one LLR associated with the bit vector; decode the polar-encoded codeword to obtain the bit vector based at least in part on the determined size of the payload; and parse the bit vector to obtain the plurality of payload bits based at least in part on the determined size of the payload.

In some examples of the method, apparatus, and non-transitory computer-readable medium described above, determining the size of the payload comprises performing one or more de-scrambling operations on at least one bit decision for the at least one LLR, wherein each de-scrambling operation utilizes a masking vector corresponding to a payload size.

Some examples of the method, apparatus, and non-transitory computer-readable medium described above may further include processes, features, means, or instructions for identifying a successful de-scrambling operation based at least in part on comparing a plurality of de-scrambled parity bits to a plurality of de-scrambled payload bits. Some examples of the method, apparatus, and non-transitory computer-readable medium described above may further include processes, features, means, or instructions for determining the size of the payload as the payload size corresponding to the masking vector for the successful de-scrambling operation.

In some examples of the method, apparatus, and non-transitory computer-readable medium described above, the de-scrambling operation comprises an inverse XOR operation.

In some examples of the method, apparatus, and non-transitory computer-readable medium described above, the polar-encoded codeword may be further generated based at least in part on a plurality of parity bits, the plurality of payload bits and the plurality of parity bits assigned to a plurality of information bit channels, and determining the size of the payload comprises performing one or more parity checks on at least one bit decision for the at least one LLR using the plurality of parity bits, wherein a positioning of the plurality of parity bits within the polar-encoded codeword for each parity check indicates a corresponding payload size.

Some examples of the method, apparatus, and non-transitory computer-readable medium described above may further include processes, features, means, or instructions for identifying a successful parity check based at least in part on the plurality of parity bits and the at least one bit decision for the at least one LLR. Some examples of the method, apparatus, and non-transitory computer-readable medium described above may further include processes, features, means, or instructions for determining the size of the payload as the corresponding payload size indicated by the positioning of the plurality of parity bits resulting in the successful parity check.

In some examples of the method, apparatus, and non-transitory computer-readable medium described above, at least one bit of the plurality of parity bits may be assigned to a least reliable channel of the plurality of information bit channels. In some examples of the method, apparatus, and non-transitory computer-readable medium described above, the plurality of parity bits comprises a plurality of CRC bits.

In some examples of the method, apparatus, and non-transitory computer-readable medium described above, determining the size of the payload comprises identifying a least reliable bit channel of the polar-encoded codeword with an LLR indicating an opposite bit value to a default frozen bit value. Some examples of the method, apparatus, and non-transitory computer-readable medium described above may further include processes, features, means, or instructions for determining the size of the payload based at least in part on the identified least reliable bit channel.

In some examples of the method, apparatus, and non-transitory computer-readable medium described above, parsing the bit vector comprises removing an initial bit corresponding to the LLR indicating the opposite bit value to the default frozen bit value.

In some examples of the method, apparatus, and non-transitory computer-readable medium described above, parsing the bit vector comprises reordering bits of the bit vector based at least in part on the LLR indicating the opposite bit value to the default frozen bit value.

DETAILED DESCRIPTION

Figure 1:
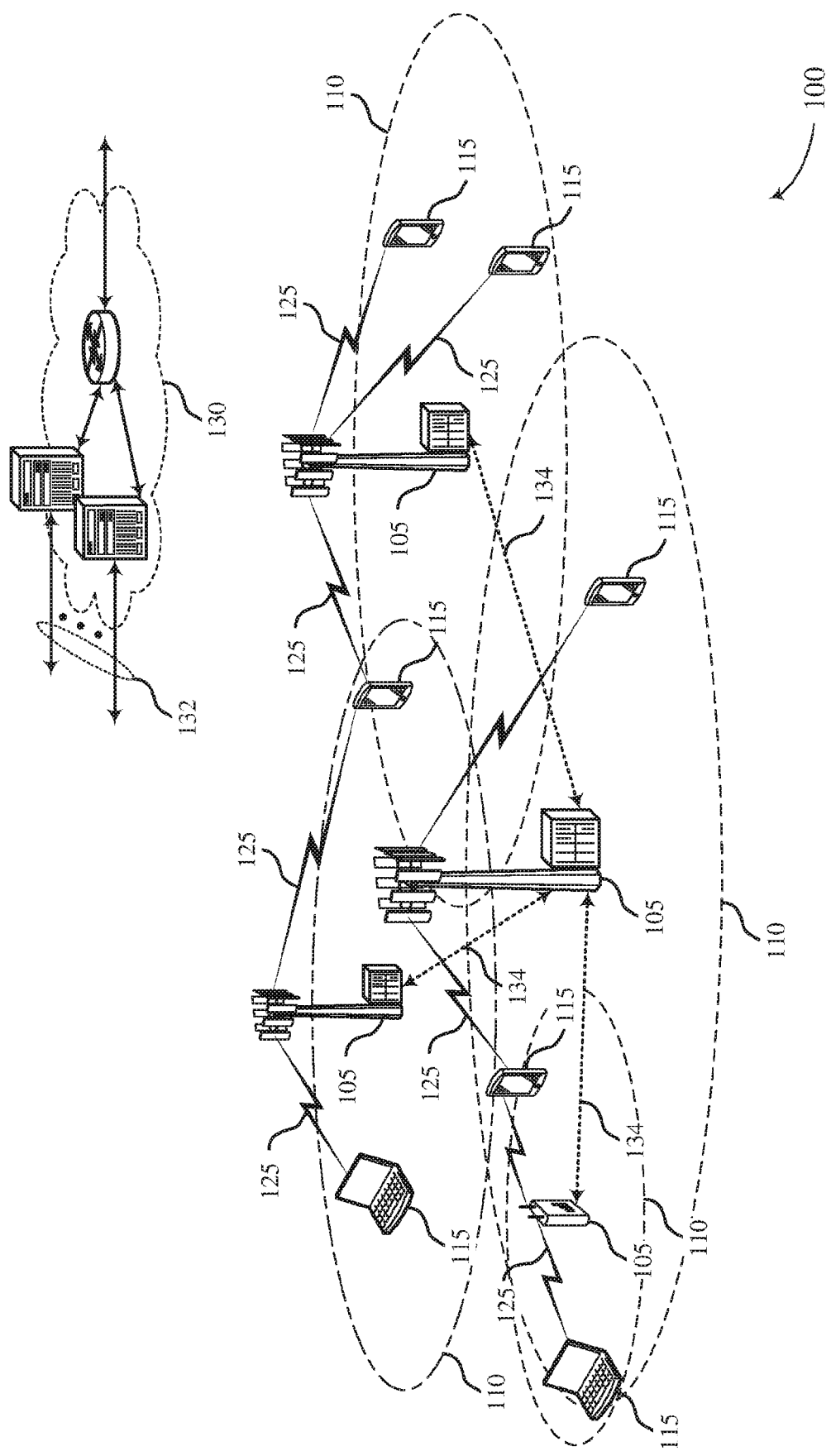
FIG. 1 illustrates an example of a wireless communications system that supports polar coding techniques for blind detection of different payload sizes in accordance with aspects of the present disclosure.

In some wireless communications systems, wireless devices (e.g., base stations or user equipments (UEs)) may implement polar codes to encode and decode transmissions. In some cases, a transmitting device may select a payload for transmission. The size of the payload may be configurable, for example, from a list of possible payload sizes. In some cases, the transmitting device may implement one or more techniques to indicate the selected payload size to a device decoding the codeword. These techniques may result in a unique codeword for any payload, so that a device blind decoding the codeword may correctly determine the encoded payload. For example, a receiving device may monitor for codewords generated using any of the possible payload sizes. The receiving device may implement one or more techniques corresponding to the techniques utilized by the transmitting device in order to determine the payload size of a codeword.

To perform these techniques, the transmitting device may determine a set of information bits for encoding, where the information bits may include the payload bits and parity bits generated based on the payload bits. These information bits may be organized into a bit vector. The transmitting device may modify the bit vector based on the size of the payload (e.g., the number of payload bits). In a first technique, the transmitting device may determine a masking vector corresponding to the payload size (e.g., from a table in memory or based on an equation). The device may mask or scramble one or more bits of the bit vector using the masking vector. In a second technique, the device may position at least a portion of the parity bits in the bit vector at lower bit indices than the payload bits. In a third technique, the device may ensure that the first bit index of the bit vector contains a different bit value than that of a default frozen bit value (e.g., if frozen bits have default values of 0, the first bit index will have a bit value of 1). For example, the device may insert an additional bit at the first bit index of the bit vector, or may arrange the payload bits so that the first bit will be a 1 bit. In some cases, the bit vector described above may be referred to as an information bit vector and may be a portion of a larger bit vector. This larger bit vector may additionally include a set of frozen bits in lower bit indices than the information bit vector. The transmitting device may assign the bits of the bit vector to corresponding bit channels (e.g., assigning each bit of the bit vector in increasing index order to a bit channel in order of increasing channel reliability), and may generate a codeword using the assigned bit channels and a polar code. The device may transmit this generated codeword to a receiving device.

The receiving device may decode the codeword using a blind decoding process. For example, the receiving device may decode the received signal using one or more hypotheses for the payload size. For each of the techniques described above, the decoding process may fail if the receiving device assumes an incorrect payload size hypothesis. For example, in the first two techniques, a parity check or cyclic redundancy check (CRC) may fail if the codeword is decoded using an incorrect masking vector or an incorrect starting position for the CRC. In the third technique, the receiving device may determine the position of the first information bit within the bit vector, as this first information bit will be the first bit with a value different than the default frozen bit value. Using one or more of these techniques, the receiving device may successfully decode codewords of different payload sizes.

Aspects of the disclosure are initially described in the context of a wireless communications system. Additional aspects are described with respect to a polar coding device, an encoding process, payload size indications, and a process flow. Aspects of the disclosure are further illustrated by and described with reference to apparatus diagrams, system diagrams, and flowcharts that relate to polar coding techniques for blind detection of different payload sizes.

FIG. 1 illustrates an example of a wireless communications system 100 that supports polar coding techniques for blind detection of different payload sizes in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, or a New Radio (NR) network. In some cases, wireless communications system 100 may support enhanced broadband communications, ultra-reliable (e.g., mission critical) communications, low latency communications, or communications with low-cost and low-complexity devices. In some cases, the wireless devices of wireless communications system 100 (e.g., base stations 105 and UEs 115) may utilize polar coding techniques.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a CRC), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an Evolved Universal Terrestrial Radio Access (UTRA) (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency-division multiplexing (OFDM) or discrete Fourier transform-spread OFDM (DFT-s-OFDM).

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems 100 such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some wireless communications systems 100, base stations 105 and UEs 115 may implement polar codes to encode and decode transmissions. In some cases, a transmitting device (e.g., a base station 105 or a UE 115) may select a payload for transmission. The size of the payload may be configurable, for example, from a list of possible payload sizes or based on the length of the codeword. In some cases, a receiving device monitoring for a codeword may monitor for any of the possible payload sizes or codeword lengths. These decoding attempts, where the decoder does not know the codeword or payload sizes, may be referred to as blind decoding.

To improve the success of blind decoding processes, the transmitting device may encode the codeword using one or more techniques to indicate the payload size. The transmitting device may determine a set of information bits for encoding, where the information bits may include the payload bits and parity bits generated based on the payload bits. These information bits may be organized into a bit vector. The transmitting device may modify the bit vector based on the size of the payload (e.g., the number of payload bits). In a first technique, the transmitting device may determine a masking vector corresponding to the payload size (e.g., from a table in memory or based on an equation). The device may mask or scramble one or more bits of the bit vector using the masking vector. In a second technique, the device may position at least a portion of the parity bits in the bit vector at lower bit indices than the payload bits. In a third technique, the device may ensure that the first bit index of the bit vector contains a bit value different than that of a default frozen bit value (e.g., if the frozen bits have values of 0, the first bit index will have a value of 1). For example, the device may insert an additional bit at the first bit index of the bit vector, or may arrange the payload bits so that the first bit will be a 1 bit. In some cases, the bit vector described above may be referred to as an information bit vector and may be a portion of a larger bit vector that contains one or more frozen bits preceding the information bit vector. The transmitting device may assign the bits of the bit vector to corresponding bit channels, and may generate a codeword using the assigned bit channels and a polar code. The device may transmit this generated codeword to a receiving device (e.g., a base station 105 or a UE 115).

The receiving device may decode the codeword using a blind decoding process. For example, the receiving device may decode the received signal using one or more hypotheses for the payload size. For each of the techniques described above, the decoding process may fail if the receiving device assumes an incorrect payload size hypothesis. For example, in the first two techniques, a parity check or CRC may fail if the codeword is decoded using an incorrect masking vector or an incorrect starting position for the CRC. In the third technique, the receiving device may determine the position of the first information bit within the bit vector, as this first information bit will be the first bit with a value different than the default frozen bit value. Using one or more of these techniques, the receiving device may successfully decode codewords of different payload sizes.

Figure 2:
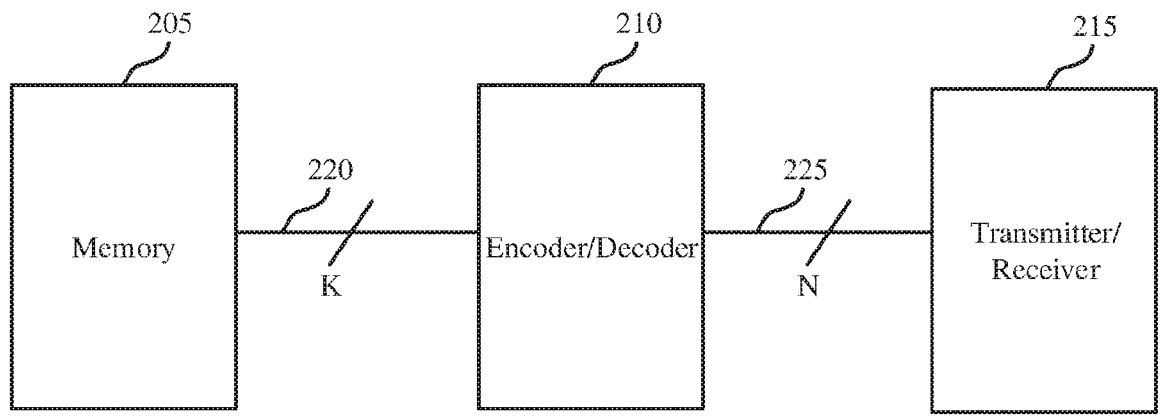
FIG. 2 illustrates an example of a device that supports polar coding techniques for blind detection of different payload sizes in accordance with aspects of the present disclosure.

FIG. 2 illustrates an example of a device 200 that supports polar coding techniques for blind detection of different payload sizes in accordance with aspects of the present disclosure. The device 200 may be included in any device within a wireless communications system 100 that performs an encoding or decoding process (e.g., using an error-correcting code, such as a polar code). For example, device 200 may be included in a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some instances, device 200 may have data stored in memory 205 to be transmitted to another device, such as a UE 115 or base station 105. To initiate the transmission process, device 200 may retrieve from memory 205 the data for transmission. The data may include a number of payload bits, 'A,' which may be 1s or 0s, provided from memory 205 to encoder/decoder 210 via first bus 220. In some cases, these payload bits may be combined with a number of parity bits, 'L,' to form a total set of information bits, 'A+L.' The number of information bits may be represented as a value 'K,' as shown. The encoder/decoder 210 may encode the information bits and output a codeword having a length 'N,' which may be different than or the same as K. The bits that are not allocated as information bits (i.e., N−K bits) may be assigned as frozen bits. In some cases, the information bits may be assigned to the K most reliable bit channels, and the frozen bits may be assigned to the remaining bit channels. Frozen bits may be bits of a default value (e.g., 0 or 1 or some other value) known to both the encoder and decoder (i.e., the encoder encoding information bits at a transmitter and the decoder decoding the codeword received at a receiver). Further, from the receiving device perspective, device 200 may receive encoded data via receiver 215, and may decode the encoded data using decoder 210 to obtain the transmitted data.

In some wireless systems, decoder 210 may be an example of a successive cancellation (SC) or a successive cancellation list (SCL) decoder. A UE 115 or base station 105 may receive a transmission including a codeword at receiver 215, and may pass the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and may calculate a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics and may output the bits corresponding to the selected decoding path as the decoded sets of bits. For example, the SCL decoder may select the decoding paths with the highest path metrics.

If an SCL decoder determines that the first number of bits are all frozen bits, the SCL decoder may determine that the correct decoding path for the first number of bits must be the default frozen bit values (e.g., if the default frozen bit value is 0, the correct decoding path for the first number of bits must be all 0's). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1) without subsequent decoding operations. However, the SCL decoder may still determine bit metrics for the bit channels containing frozen bits and may use these bit metrics when calculating path metrics for the decoding path candidates. For example, the SCL decoder may update the path metric for the decoding candidates after every bit, regardless of bit type (e.g., after each frozen bit or information bit).

To decode a polar coded codeword, device 200 may perform blind decoding. For example, receiver 215 may be configured with a set of candidate hypotheses for the codeword, where each candidate may correspond to a set of N:K or N:A hypotheses. Receiver 215 may identify one or more candidate codewords received over a channel, and may attempt to process each candidate codeword using different N:K or N:A assumptions. In some cases, decoder 210 may decode the signal received by receiver 215 to obtain a set of information bits, which may include parity bits and payload bits for a data payload. Decoder 210 may perform a CRC or parity check on the payload bits for the data payload using the parity bits, and may determine that the data payload represents a successfully decoded codeword intended for device 200 if the parity check passes.

However, in some cases, the decoding operation may fail because the codeword has experienced excessive corruption (e.g., the channel has a very low signal to noise ratio (SNR)), there is no transmitted codeword for the candidate hypothesis (e.g., the codeword represents random noise), the transmitted codeword is intended for a different device, or the candidate hypothesis may be incorrect (e.g., the N:K or N:A assumptions are incorrect). In these cases, decoder 210 may detect a decoding failure and attempt decoding using a different candidate codeword.

Further, in some cases of blind decoding, the decoder 210 may not be able to distinguish between certain codewords. In a blind decoding process, for example, the decoder 210 may identically process frozen bits and information bits that have the same bit value as the frozen bits. For example, if the decoder 210 has not identified the number of information bits, K, within the codeword, the decoder 210 may not be able to determine whether an LLR indicating the default frozen bit value (e.g., a 0) corresponds to a frozen bit or an information bit that happens to have the same value. Accordingly, if an encoder 210 maps information bits with frozen bit values (e.g., information bits with values of 0) to the least reliable information bit channels, a decoder 210 receiving the codeword may not be able to determine whether those bit channels are the least reliable information bit channels or the most reliable frozen bit channels. In such cases, the decoder 210 may not be able to determine the correct number of information bits, K, or payload bits, A, encoded in the codeword.

In some cases, parity bits may not indicate whether bits having the same values as frozen bits are information bits or frozen bits. For example, if the parity bits are CRC bits, the encoder 210 may determine the bit values for the parity bits based on the payload bits. However, the parity bits may be determined by the encoder 210 in order of increasing payload reliability, and may not be updated in view of frozen bit values. For example, the encoder 210 may generate a default parity bit string corresponding to a portion of—or the entire—set of payload bits. The encoder 210 may update the default parity bit string for each payload bit with a bit value of 1, and may not update the parity bit string for payload bits with a bit value of 0 (e.g., if the frozen bits have bit values of 0). In this way, when a decoder 210 decodes the payload bits, the decoder 210 may perform the same process to determine a parity bit string, and may compare the determined parity bit string to the actual received parity bit string to determine if the payload bits are decoded correctly (e.g., if the parity bit strings match). However, as the encoder 210 does not update the default parity bit string for leading information bits with values of 0, the parity bit strings may be identical for a payload with leading 0 bits and for a payload of otherwise the same bits but without the leading 0 bits.

In one specific example of information bit index mapping, an encoder 210 may, in a first case, encode 78 information bits (e.g., 54 payload bits and 24 CRC bits) within a 108 bit codeword. The encoder 210 may select the 78 most reliable bit channels of the 108 total bit channels for the polar code and may map the 78 information bits to these 78 selected bit channels. In such a case, the most reliable bit channel of the 108 total bit channels may be bit channel 107 and bit channel 14 may be the least reliable of the 78 selected information bit channels. The encoder 210 may generate a bit vector containing the payload bits and the CRC bits (e.g., with the CRC bits at the end of the bit vector, or with the CRC bits interleaved throughout the bit vector, etc.) and may assign the bits of the bit vector to the information bit channels. For example, the encoder 210 may assign the information bit in the first bit index of the bit vector to the least reliable information bit channel (e.g., bit channel 14). If this first information bit is a 0 bit (e.g., the frozen bit value), the encoder 210 may set bit channel 14 to a 0 bit. However, if in another case the encoder 210 encodes 77 information bits (e.g., 54 payload bits and 24 CRC bits) within a 108 bit codeword, bit channel 14 may be the most reliable frozen bit channel. In either case, the encoder 210 may assign a 0 bit to bit channel 14. Hence, if the remaining 77 bits of the bit vectors are the same in the two cases described above, the encoder 210 may output identical codewords for the two cases, despite the first codeword including 78 information bits and the second codeword including 77 information bits. Accordingly, a decoder 210 blind decoding these codewords may not be able to determine whether the codeword includes 77 or 78 information bits.

To facilitate differentiation between codewords like the two described above, the encoder 210 may include an indication of the payload size (e.g., the number of payload bits) or the number of information bits in the codeword. For example, the encoder 210 may modify the bit vector (e.g., an order of the bit vector or content of the bit vector) based on the payload size. In a first such technique, the encoder 210 may perform a masking operation on the bit vector using a masking vector, where the selected masking vector is based on the payload size. In a second such technique, the encoder 210 may arrange the payload bits and parity bits in the bit vector such that one or more of the parity bits are positioned first in the bit vector. If at least one of the front-loaded parity bits has a different bit value than the default frozen bit value (e.g., if at least one of these parity bits is a 1), a decoder 210 may be able to determine the correct number of payload or information bits in the codeword. In a third such technique, the encoder 210 may modify the contents of the bit vector to indicate the start of the information bits. As one example of such a third technique, the encoder 210 may insert a 1 bit at the front of the bit vector to indicate the least reliable of the information bit channels. As another example of such a third technique, the encoder 210 may arrange the payload bits such that a first bit in the bit vector is a 1 bit. Any of these techniques may provide an indication of the least reliable information bit channel to a decoder 210 decoding the codeword. Based on the index of this indicated channel, the codeword size, and the configured number of parity bits (e.g., the encoder 210 and decoder 210 may include an indication of the configured number of parity or CRC bits for a codeword), the decoder 210 may determine the number of payload bits in a blind decoding process even in problematic cases such as those described above, which may aid the decoder 210 in correctly determining the transmitted data payload without any negative impact to the block error ratio (BLER).

Figure 3:
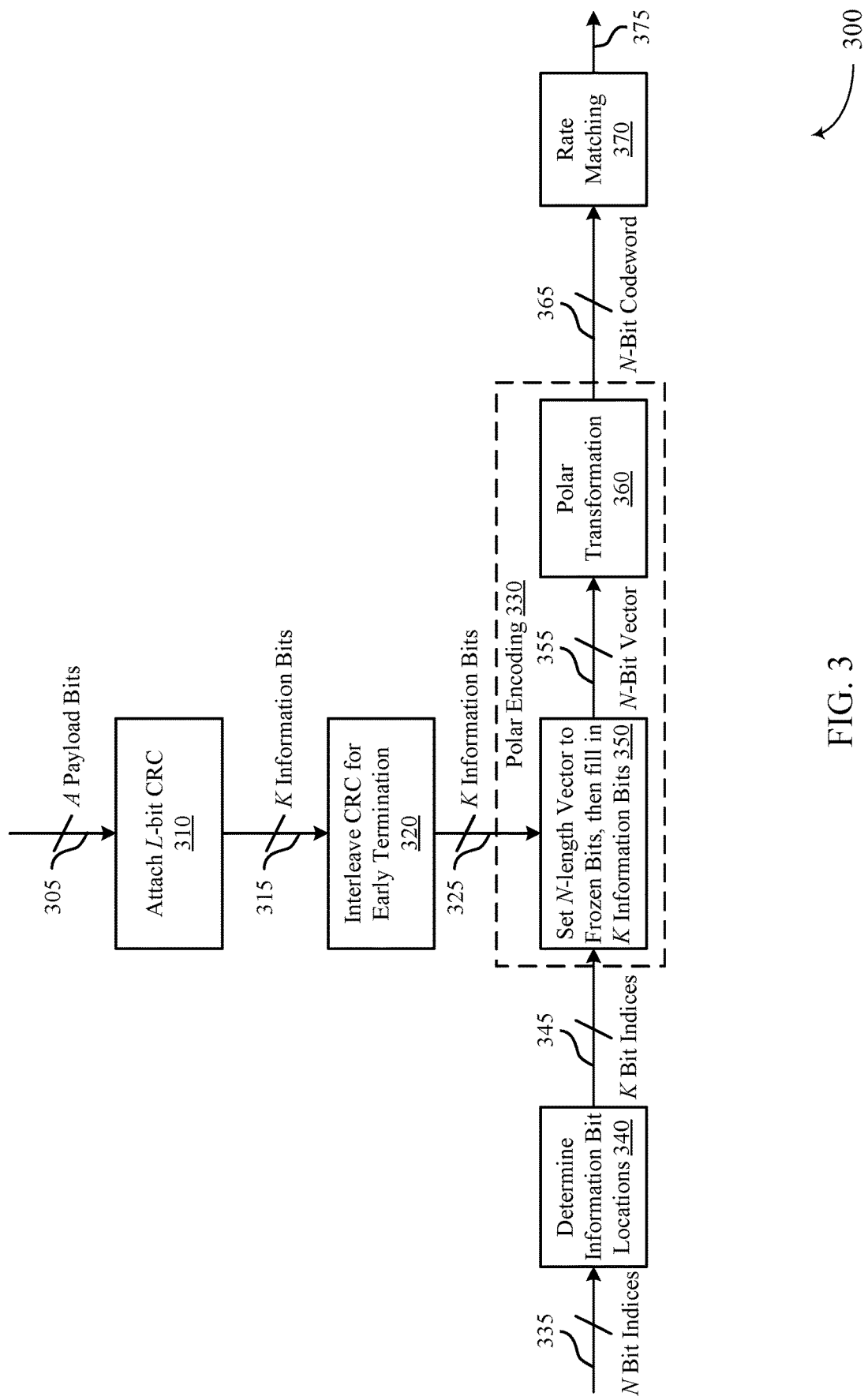
FIG. 3 illustrates an example of a polar encoding process that supports polar coding techniques for blind detection of different payload sizes in accordance with aspects of the present disclosure.

FIG. 3 illustrates an example of a polar encoding process 300 that supports polar coding techniques for blind detection of different payload sizes in accordance with aspects of the present disclosure. The polar encoding process 300 may be performed by an encoder 210 as described above, for example, with reference to FIG. 2. The encoder 210 may be a component of a wireless device, such as a base station 105 or a UE 115, as described with reference to FIG. 1. The polar encoding process 300 may include bit vector manipulation to indicate a payload size to aid in blind decoding at a receiving device.

At 305, an encoder may receive a number of payload bits, A, corresponding to a data payload. For example, the device may send information from memory, represented by the payload bits, to the encoder. This information may be encoded into a codeword and transmitted to a receiving device.

At 310, the encoder may generate and attach an L-bit CRC to the A payload bits to form a set of K information bits. In some cases, the encoder may use other forms of parity bits instead of or in addition to the CRC bits. To determine the CRC bits, the encoder may perform a CRC operation on the payload bits. This CRC operation may be known to a receiving device as well, so that a receiving device decoding the codeword may use the same CRC operation to determine whether the decoding process was successful. In some CRC operations, the generated CRC bits may not be affected by leading zeros in the payload.

At 315, the encoder may optionally pass the K information bits (e.g., including the A payload bits and the L CRC bits) to an interleaver. At 320, the interleaver may interleave portions of the CRC bits throughout the payload bits (e.g., to support early termination at a decoder). For example, for a 24-bit CRC, a 6-bit CRC may be positioned approximately a quarter of the way through the information bits, another 6-bit CRC may be positioned halfway through the information bits, and the remaining 12-bit CRC may be positioned at the end of the information bits. At 325, the interleaver may pass the interleaved K information bits to a polar encoding process 330.

In addition to the K information bits, the polar encoding process 330 may receive K bit indices corresponding to bit channels for the information bits. For example, at 335, the encoder may receive a number of bit indices, N, corresponding to the length of the codeword. At 340, the encoder may determine the information bit locations based on the number of bit indices, N, and the number of information bits to encode within the codeword, K. For example, the encoder may store a table in memory indicating the K most reliable bit channels within N total bit channels for multiple N, K pairs. In other cases, the encoder may include a function that determines the most reliable bit channels for a polar code based on inputting the N and K values. At 345, the encoder may pass the K bit indices corresponding to these K most reliable bit channels to the polar encoding process 330.

At 350, the encoder may set each bit of an N-length bit vector to frozen bit values (e.g., 0). Alternatively, the encoder may set the first N–K bits of the bit vector to the frozen bit value. In either case, the encoder may fill in the bit vector with the information bits. For example, starting with the bit index following the N–K frozen bits, the encoder may insert the first bit of the information bits into the bit vector, and may continue inserting information bits into the bit vector until the last information bit is inserted into the last bit index of the N-length bit vector.

To support blind detection of different payload sizes, the encoder may modify this bit vector using one or more techniques. For example, the encoder may scramble the A payload bits, the L parity bits, the N–K frozen bits, or any combination of these bits using a masking value or vector corresponding to the payload size, A, or the number of information bits, K (e.g., where the number of information bits is implicitly based on the payload size and a configured number of CRC bits, L). In another example, the encoder (e.g., at the interleaver or during the polar encoding process 330) may position one or more CRC bits after the frozen bits in the bit vector, where at least one of the CRC bits has a bit value different than the frozen bits (e.g., a bit value of 1 if the frozen bits have a bit value of 0). In yet other examples, the encoder may either insert an additional bit having a bit value different than the frozen bits (e.g., a bit value of 1 if the frozen bits have a bit value of 0) after the frozen bits or may arrange the payload bits such that the first bit after the frozen bits has a bit value different than the frozen bits (e.g., a bit value of 1 if the frozen bits have a bit value of 0). With any of these techniques, alone or in combination, the encoder may modify the bit vector such that the bits within the bit vector or the order of the bits within the bit vector indicates the payload size or the number of information bits.

At 355, the encoder may send this modified N-bit bit vector to a polar encoding operation, where the encoder may perform a polar transformation 360 on the N-bit vector. For example, the polar transformation 360 may assign the N bits of the bit vector to the N bit channels of the polar code, where the K information bits are assigned to the most reliable channels according to the K bit indices received at 345. Based on these bit channel assignments, the encoder may transform the bits using a polarizing transform (e.g., implementing F and G operations) to determine the bits to transmit within a codeword. This polarizing transform may result in the different reliabilities for the bit channels.

At 365, the encoder may send the N-bit codeword resulting from the polar encoding process 330 to a rate matching process 370. The rate matching process 370 may modify the codeword for transmission at a specific coding rate. Following the rate matching process 370, the codeword may be sent to a transmitter at 375. The transmitter may transmit the codeword over a channel to a receiving device. In some cases (e.g., if the receiving device has not previously received a codeword from the transmitting device, or if the transmitting device modified a payload size for transmission), the receiving device may use N, K or N, A hypotheses in a blind decoding process to determine the size of the payload transmitted using the codeword. Based on the modification to the bit vector (e.g., an order of the bit vector or content of the bit vector), the receiving device may correctly determine the payload size of the received codeword, regardless of leading zero bits in the payload.

Figure 4A:
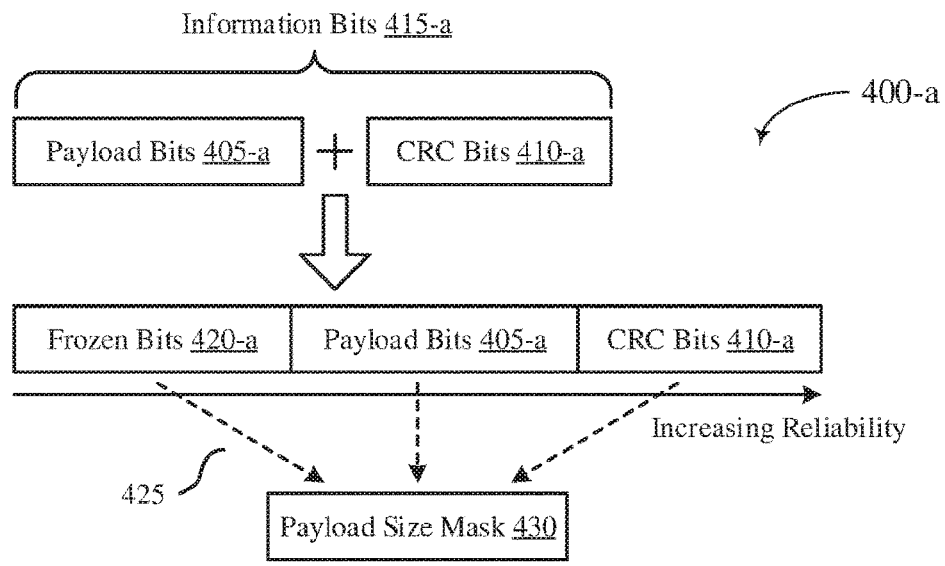
FIGS. 4A, 4B, and 4C illustrate examples of payload size indications that support polar coding techniques for blind detection of different payload sizes in accordance with aspects of the present disclosure.
Figure 4B:
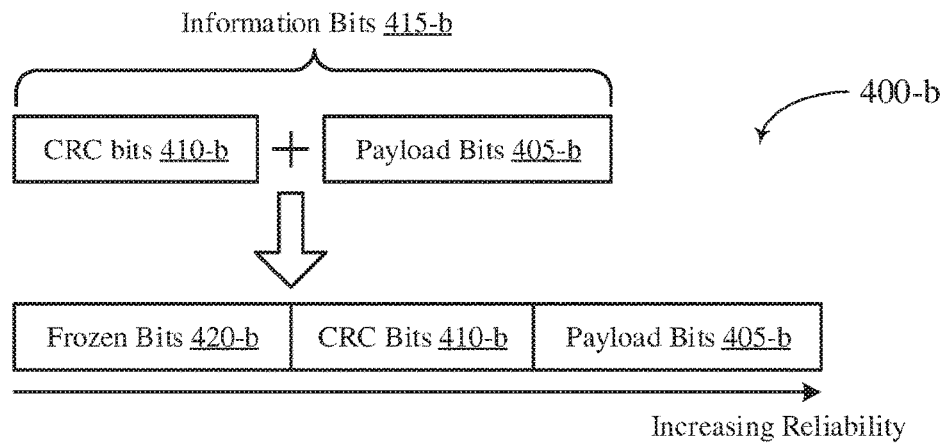
Figure 4C:
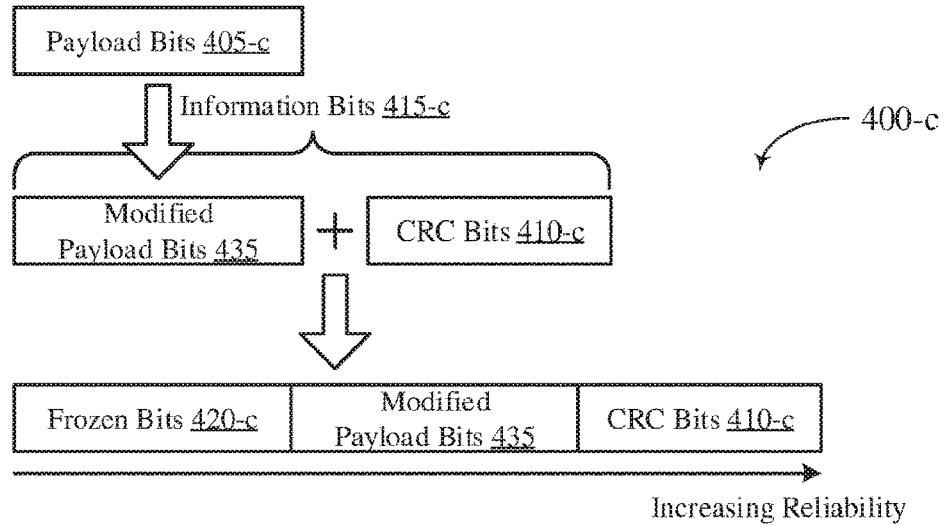

FIGS. 4A, 4B, and 4C illustrate examples of payload size indications 400 that support polar coding techniques for blind detection of different payload sizes in accordance with aspects of the present disclosure. The payload size indications 400 may be incorporated into bit vectors for blind detection of different payload sizes. These payload size indications 400 may facilitate determination by a decoder of a payload size based on a single polar decoding process.

FIG. 4A illustrates an example of a payload size indication 400-a that supports polar coding techniques for blind detection of different payload sizes in accordance with aspects of the present disclosure. The payload size indication 400-a includes information bits 415-a, which may include both payload bits 405-a and parity bits (e.g., CRC bits 410-a) associated with the payload bits 405-a. The information bits 415-a may be combined with frozen bits 420-a to form a bit vector. An encoder (e.g., as described with respect to FIGS. 2 and 3) may modify this bit vector based on a payload size in order to indicate the payload size.

For example, the encoder may include a mapping of payload sizes to masking vectors or values (e.g., referred to as a payload size mask 430). In some cases, the encoder may store a table in memory, where each configurable payload size indicates to a corresponding payload size mask 430. In some examples, this mapping may be further based on the codeword size, the number of CRC bits 410-a, or some combination of these. The encoder may determine the payload size mask 430 based on the payload size, and may perform a masking or scrambling operation 425 on the bit vector using the determined payload size mask 430. For example, the masking or scrambling operation 425 may be an example of an exclusive or (XOR) operation. Depending on the size of the payload size mask 430, this masking or scrambling operation 425 may be performed as a bit-wise operation, or may be performed on portions of the bit vector. The size of the payload size mask 430 may depend on the number of possible payload sizes (e.g., if the encoder supports two possible payload size configurations, the encoder may incorporate a one bit payload size mask 430, where a mask with a value of 0 indicates one payload size and a mask with a value of 1 indicates the other payload size). Additionally or alternatively, the size of the payload size mask 430 may depend on the number of bits to scramble or mask (e.g., in order for the vector-to-vector masking or scrambling operation 425 to be performed). In some cases, the encoder may perform the masking or scrambling operation 425 on one or more of the frozen bits 420-a, the payload bits 405-a, the CRC bits 410-a, or any combination of these bits. The encoder may use this masked or scrambled bit vector to generate a codeword using a polar code.

A receiving device receiving the codeword (e.g., as a candidate codeword in a blind detection process) may send the codeword to a polar decoder for blind decoding. The polar decoder may determine decoded LLRs based on the received LLRs for the codeword, and may make soft or hard bit decisions based on these decoded LLRs. Each of these decoded LLRs may correspond to a bit of the modified bit vector. To determine the decoded LLRs, the decoder may assume an N, K hypothesis. The decoder may use the K value of the hypothesis to determine an assumed payload size based on a configured number of CRC bits 410-a. The decoder may contain the same mapping of payload sizes to payload size masks 430 in memory. Using this mapping, the decoder may select the payload size mask 430 corresponding to the assumed payload size, and may de-mask or de-scramble the hard bit decisions for the decoded LLRs using the selected payload size mask 430. If the de-masked or de-scrambled bits pass the CRC (e.g., based on the payload bits 405-a and the CRC bits 410-a), the decoder may determine that the correct payload size was assumed. Using these techniques, the decoder may determine the correct data payload (e.g., payload bits 405-a) even if the payload bits 405-a include leading bits having the same value as frozen bits (e.g., leading 0 bits).

FIG. 4B illustrates an example of a payload size indication 400-b that supports polar coding techniques for blind detection of different payload sizes in accordance with aspects of the present disclosure. The payload size indication 400-b includes information bits 415-b, which may include both payload bits 405-*b* and CRC bits 410-*b* associated with the payload bits 405-*b* (e.g., determined based on the payload bits 405-*b*). The information bits 415-*b* may be combined with frozen bits 420-*b* to form a bit vector. An encoder (e.g., as described with respect to FIGS. 2 and 3) may modify the interleaving of information bits 415-*b* within this bit vector to indicate the payload size. While the following is described with respect to CRC bits, it should be understood that the operations apply to any type of parity or check bits.

To indicate the size of the payload, the encoder may position one or more CRC bits 410-*b* ahead of the payload bits 405-*b* in the bit vector. For example, the CRC bits 410-*b* may be placed at lower bit indices than the payload bits 405-*b*. In some cases, the encoder may interleave CRC bits 410-*b* throughout the payload bits 405-*b*, but may position one or more CRC bits at the bit indices directly following the frozen bits 420-*b* in the bit vector, where at least one of these CRC bits has a different bit value than the default frozen bit value. This at least one CRC bit—and any other contiguous CRC bits—may be referred to as front-loaded CRC bits. The encoder may use this arrangement of bits in the bit vector to encode the codeword for transmission. For example, the encoder may map the reordered bit vector to bit channels of the polar code, where the bits of the bit vector are mapped in increasing index order to bit channels of the polar code in ascending reliability order.

A decoder decoding the codeword at a receiving device may perform one or more CRCs on the decoded bits based on one or more hypotheses for the position of the front-loaded CRC bits. For example, the encoder and decoder may be configured with a set number of CRC bits for front-loading in the bit vector. Based on the received LLRs, the set number of front-loaded CRC bits, the possible payload size configurations, or any combination of these parameters, the decoder may perform CRCs using different hypotheses for the positioning of the front-loaded CRC bits. If a hypothesis passes the CRC, the decoder may determine that the assumed front-loaded CRC position is correct. In such cases, based on the positioning of the front-loaded CRC, the decoder may determine the number of information bits 415-*b* encoded in the codeword and, accordingly, the payload size. In this way, even if the payload bits 405-*b* or the CRC bits 410-*a* include leading 0 bits, the CRC will only pass if the correct payload size is assumed at the decoder.

FIG. 4C illustrates an example of a payload size indication 400-*c* that supports polar coding techniques for blind detection of different payload sizes in accordance with aspects of the present disclosure. The payload size indication 400-*c* includes information bits 415-*c*, which may include both payload bits 405-*c* and CRC bits 410-*c* associated with the payload bits 405-*c*. An encoder (e.g., as described with respect to FIGS. 2 and 3) may modify the payload bits 405-*c* to indicate the payload size. The encoder may combine these modified payload bits 435 with the CRC bits 410-*c* to form the information bits 415-*c*, and may further combine the information bits 415-*c* with the frozen bits 420-*c* to form a bit vector for encoding.

In a first example, the encoder may append a single bit to the front of the payload bits 405-*c* to form the modified payload bits 435. This single bit may have a bit value different than that of the frozen bits. For example, if the default frozen bit value is 0, the encoder may insert a bit of bit value 1. This inserted bit may be positioned in the bit index directly following the frozen bits 420-*c* within the bit vector.

In some cases, the bit is inserted by changing (e.g., switching from 0 to 1) the value of the frozen bit in the highest bit index within the bit vector. In other cases, the encoder may select a number of information bits 415-*c* for encoding based on the additional bit. For example, the number of information bits 415-*c* may equal the sum of the number of payload bits 405-*c* and the number of CRC bits 410-*c* plus one. In certain examples, the encoder may include this additional bit to indicate different types of messages. For example, depending on the information corresponding to the data payload, the encoder may determine whether or not to insert the bit indicating the start of the information bits 415-*c* within the bit vector.

In a second example, the encoder may arrange the payload bits 405-*c* so that a bit with a particular value (e.g., a value of 1) is in this first bit position. For example, the encoder may arrange the payload bits 405-*a* for a downlink control information (DCI) format 1A message such that the bit indicating the "Flag for format 0/1A differentiation" field is positioned first in the payload. As this bit has a bit value of 1 for all DCI format 1A messages, the encoder may ensure that the first bit in the modified payload bits 435 is a 1. The encoder may then position the modified payload bits 435 in the bit vector following the frozen bits 420-*c*, so that the first information bit 415-*c* positioned in the bit index following the frozen bits 420-*c* will have a different bit value than the frozen bits 420-*c*. This bit may mark the start of the information bits 415-*c* within the bit vector and, accordingly, may indicate the payload size.

A decoder decoding the codeword at a receiving device may be configured to determine the start of the information bits 415-*c* within a codeword based on a decoded LLR indicating a value different than that of a frozen bit (e.g., for a default frozen bit value of 0, the decoder may determine the information bits 415-*c* start when identifying an LLR corresponding to a 1). Based on the identified start of the information bits within the bit vector, the decoder may correctly determine the size of the payload.

Figure 5:
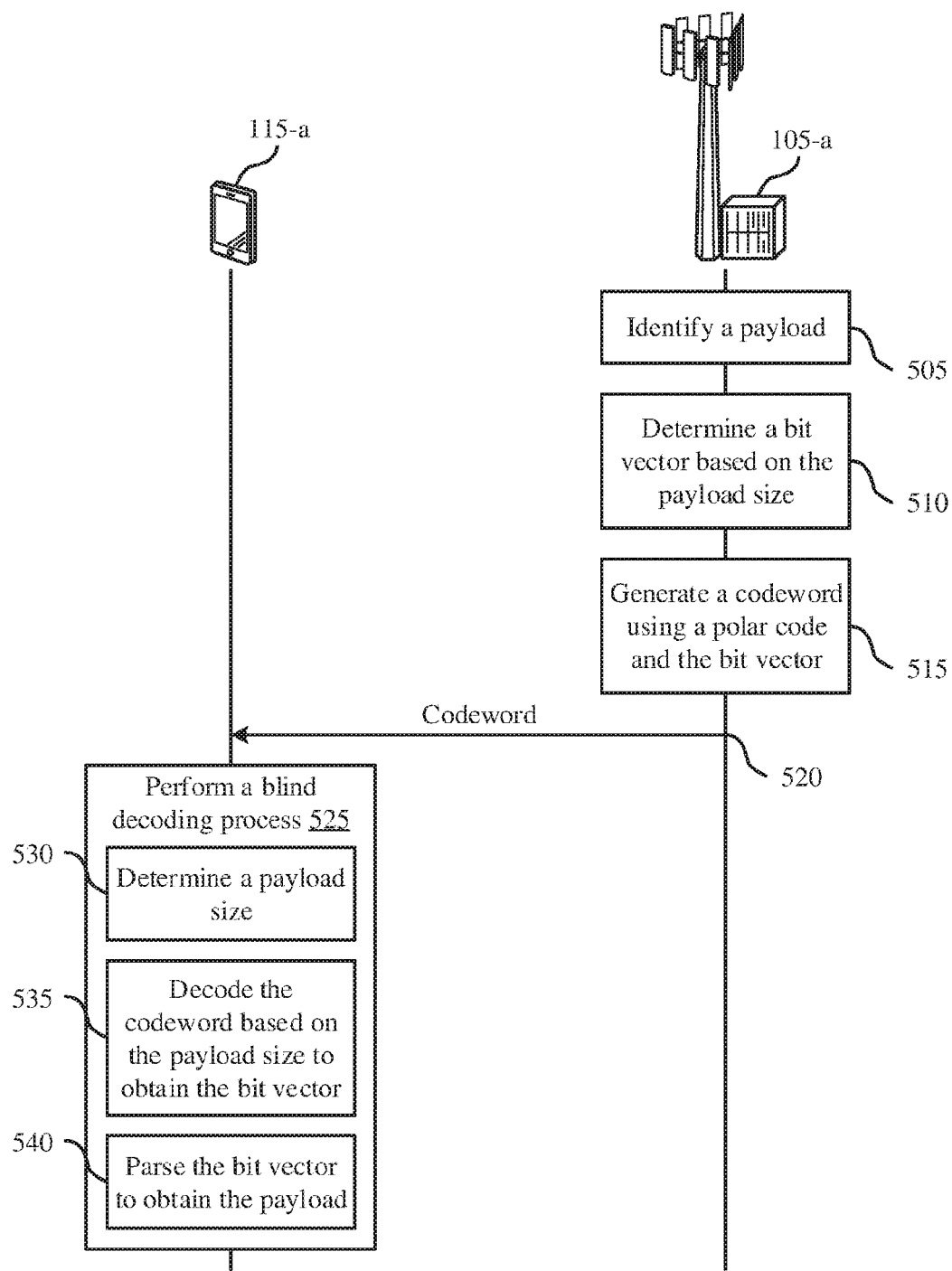
FIG. 5 illustrates an example of a process flow that supports polar coding techniques for blind detection of different payload sizes in accordance with aspects of the present disclosure.

FIG. 5 illustrates an example of a process flow 500 that supports polar coding techniques for blind detection of different payload sizes in accordance with aspects of the present disclosure. The process flow 500 may include base station 105-*a* and UE 115-*a*, which may be examples of the corresponding devices described with reference to FIG. 1. As illustrated, base station 105-*a* may perform encoding processes and UE 115-*a* may perform decoding processes on a codeword transmitted in the downlink. However, it is to be understood that UE 115-*a* may also perform the encoding processes, and base station 105-*a* the decoding processes. Additionally or alternatively, the polar coding processes described may be implemented in device-to-device (D2D) communications or backhaul communications between base stations 105 or UEs 115, or other devices.

At 505, the encoding device (e.g., base station 105-*a*) may identify a payload for transmission. The payload may include an ordered set of payload bits, which may or may not include one or more leading bits with bit values equal to a frozen bit value (e.g., leading bits with bit values of 0 if the default frozen bit value for polar codes is 0).

At 510, base station 105-*a* may determine a bit vector based on the size of the payload. The bit vector may include the set of payload bits, and in some cases may include a set of parity bits based on the payload bits, a set of frozen bits, or some combination of these bits. The bits in the bit vector or an order of the bits in the bit vector may be based on the payload size. For example, base station 105-*a* may scramble the bits in the bit vector using a masking vector, where the masking vector is determined based on the payload size. In another example, base station 105-a may position the set of parity bits in a lowest bit index of the bit vector, where the payload bits are positioned in higher bit indices of the bit vector. In some cases, the "lowest" bit index may refer to the lowest bit index amongst information bit indices, where the frozen bits may be positioned in bit indices lower than the "lowest" bit index. In yet another example, base station 105-a may append an initial bit to the bit vector, where the initial bit has a bit value different than that of the default frozen bit value. Alternatively, base station 105-a may arrange the payload bits or the parity bits such that an initial bit of the bit vector has a bit value different than that of the default frozen bit value. Similar to above, the "initial" bit may correspond to the initial information bit, where the frozen bits may precede this "initial" bit within the bit vector.

At 515, base station 105-a may generate a codeword using a polar code and the bit vector. For example, base station 105-a may assign the bits of the bit vector to bit channels of the polar code. At 520, base station 105-a may transmit the generated codeword. A receiving device (e.g., UE 115-a) may receive the codeword as a candidate codeword, and may attempt to decode the candidate codeword.

At 525, UE 115-a may perform a blind decoding process on the received codeword. For example, at 530, UE 115-a may determine a payload size for the codeword. At 535, UE 115-a may decode the codeword based on the determined payload size to obtain a bit vector. In some cases, determining the payload size and decoding the codeword may occur based on UE 115-a assuming one or more hypothesis payload sizes, and performing checks to determine if a hypothesis payload size results in a correctly decoded codeword. For example, UE 115-a may de-scramble the hard bit decisions for the LLRs of the codeword using a masking vector corresponding to the hypothesis payload size. If the de-scrambled bits pass a CRC (e.g., the de-scrambling is successful), UE 115-a may determine that the hypothesis payload size is correct. In another example, UE 115-a may perform one or more CRCs or parity checks based on assumed positions of CRC or parity bits within the bit vector, and may determine the correct payload size based on the positioning that results in a successful CRC or parity check. In yet other examples, UE 115-a may identify the least reliable bit channel with an LLR indicating a bit with a bit value different than that of the default frozen bit value, and may determine that this bit channel is the first information bit channel. Based on this determination, UE 115-a may determine the payload size. At 540, UE 115-a may parse the obtained bit vector based on the determined payload size to identify the payload bits encoded within the codeword.

Figure 6:
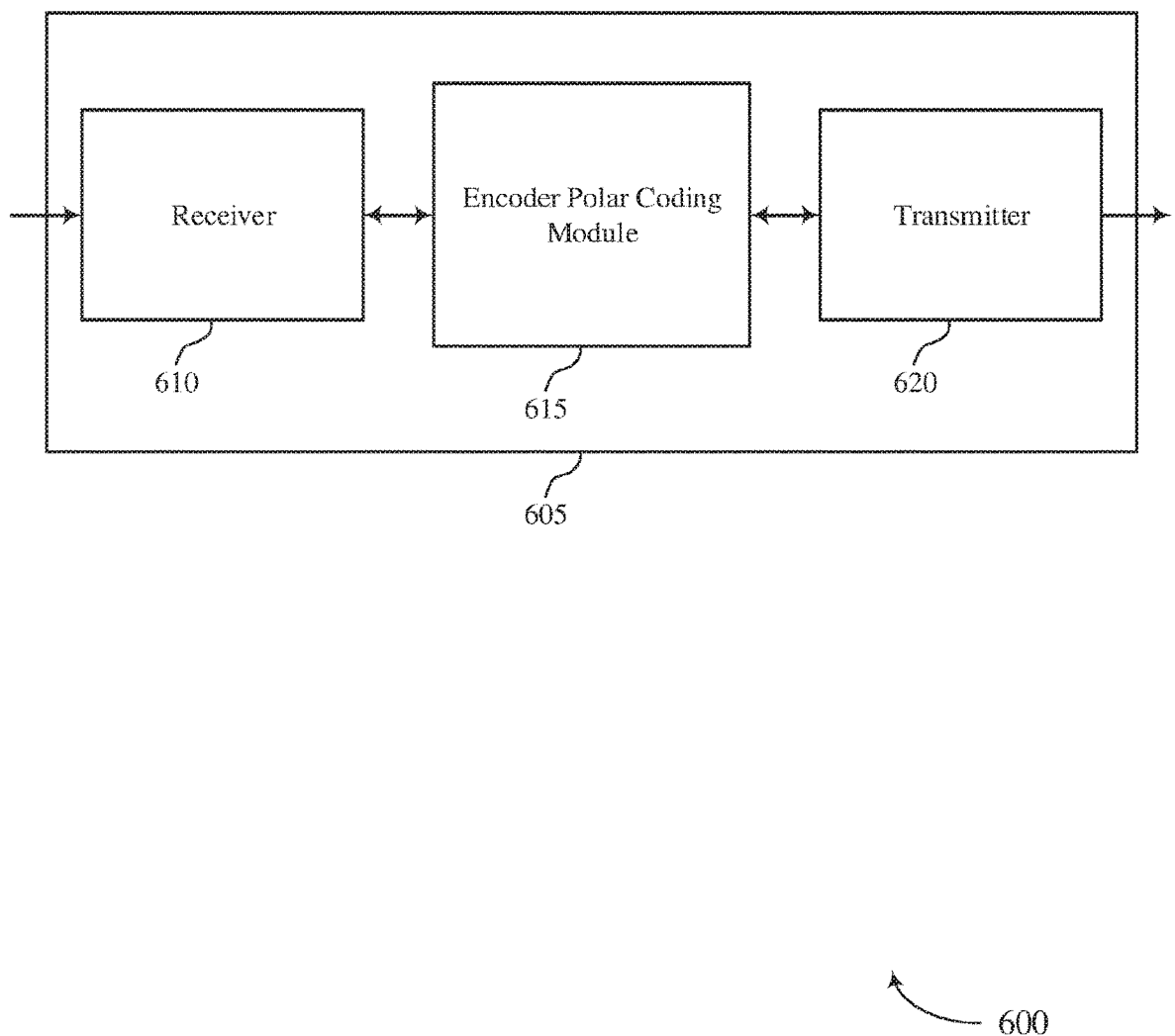
FIGS. 6 and 7 show block diagrams of a device that supports polar coding techniques for blind detection of different payload sizes in accordance with aspects of the present disclosure.

FIG. 6 shows a block diagram 600 of a wireless device 605 that supports polar coding techniques for blind detection of different payload sizes in accordance with aspects of the present disclosure. Wireless device 605 may be an example of aspects of a base station 105 or a UE 115, including an encoder, as described above with reference to FIGS. 1 and 2. Wireless device 605 may include receiver 610, encoder polar coding module 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to polar coding techniques for blind detection of different payload sizes, etc.). Information may be passed on to other components of the device. The receiver 610 may be an example of aspects of the transceiver 935 described with reference to FIG. 9. The receiver 610 may utilize a single antenna or a set of antennas.

Encoder polar coding module 615 may be an example of aspects of the encoder polar coding module 915 described with reference to FIG. 9. Encoder polar coding module 615 and/or at least some of its various sub-components may be implemented in hardware, software executed by a processor, firmware, or any combination thereof. If implemented in software executed by a processor, the functions of the encoder polar coding module 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The encoder polar coding module 615 and/or at least some of its various sub-components may be physically located at various positions, including being distributed such that portions of functions are implemented at different physical locations by one or more physical devices. In some examples, encoder polar coding module 615 and/or at least some of its various sub-components may be a separate and distinct component in accordance with aspects of the present disclosure. In other examples, encoder polar coding module 615 and/or at least some of its various sub-components may be combined with one or more other hardware components, including but not limited to an I/O component, a transceiver, a network server, another computing device, one or more other components described in the present disclosure, or a combination thereof in accordance with aspects of the present disclosure.

Encoder polar coding module 615 may identify a set of payload bits of a payload for encoding, determine a bit vector including the set of payload bits, where at least one bit or a bit order of the bit vector is based on a size of the payload, generate a polar-encoded codeword using the bit vector, and transmit the codeword.

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
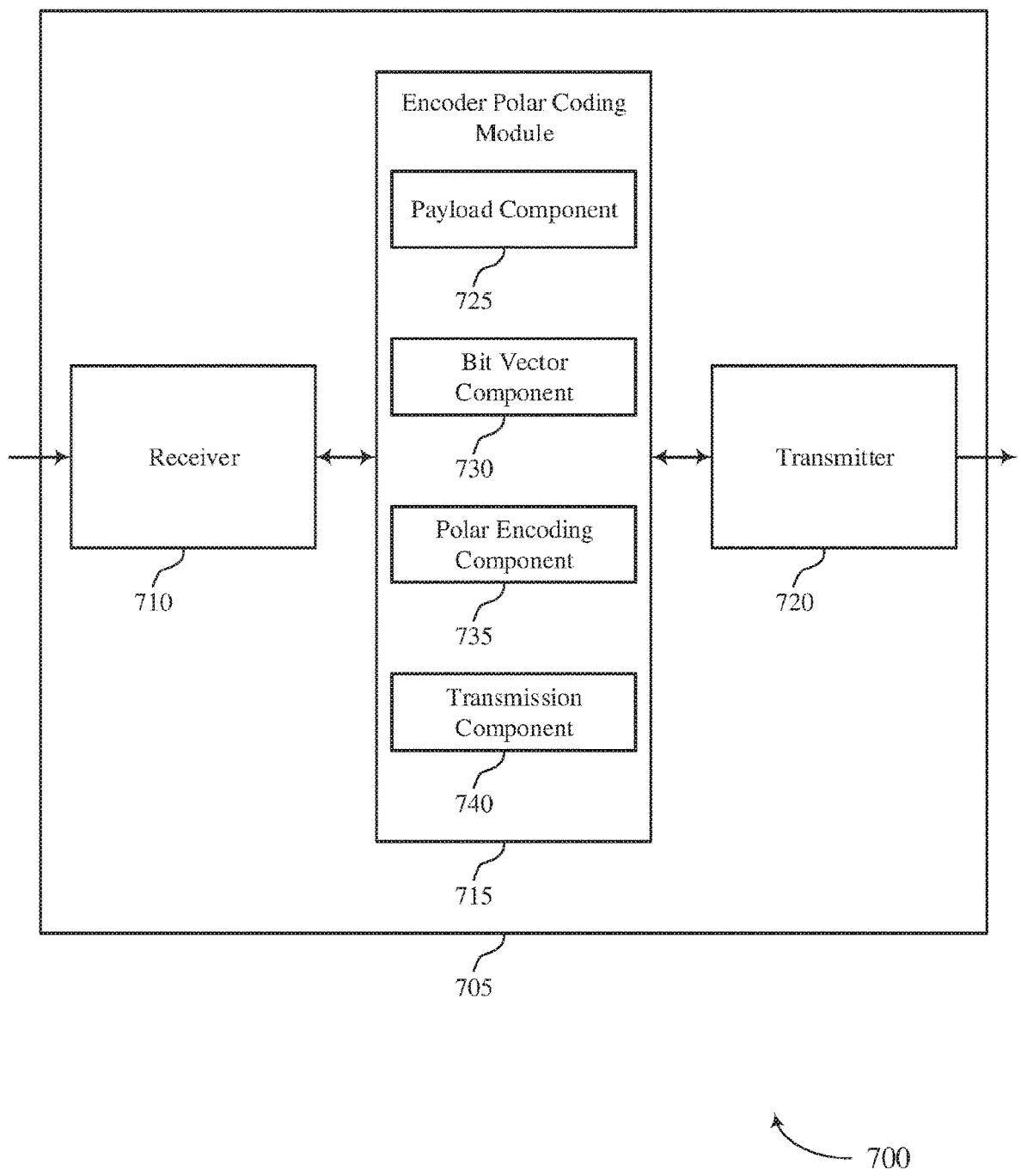

FIG. 7 shows a block diagram 700 of a wireless device 705 that supports polar coding techniques for blind detection of different payload sizes in accordance with aspects of the present disclosure. Wireless device 705 may be an example of aspects of a wireless device 605, a base station 105, or a UE 115 (e.g., including an encoder) as described above with reference to FIGS. 1, 2, and 6. Wireless device 705 may include receiver 710, encoder polar coding module 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to polar coding techniques for blind detection of different payload sizes, etc.). Information may be passed on to other components of the device. The receiver 710 may be an example of aspects of the transceiver 935 described with reference to FIG. 9. The receiver 710 may utilize a single antenna or a set of antennas.

Encoder polar coding module 715 may be an example of aspects of the encoder polar coding module 915 described with reference to FIG. 9. Encoder polar coding module 715 may also include payload component 725, bit vector component 730, polar encoding component 735, and transmission component 740.

Payload component 725 may identify a set of payload bits of a payload for encoding. Bit vector component 730 may determine a bit vector including the set of payload bits, where at least one bit or a bit order of the bit vector is based on a size of the payload. In some cases, the bit vector includes the set of payload bits and a set of parity bits associated with the set of payload bits. Polar encoding component 735 may generate a polar-encoded codeword based on the bit vector. Transmission component 740 may transmit the codeword.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
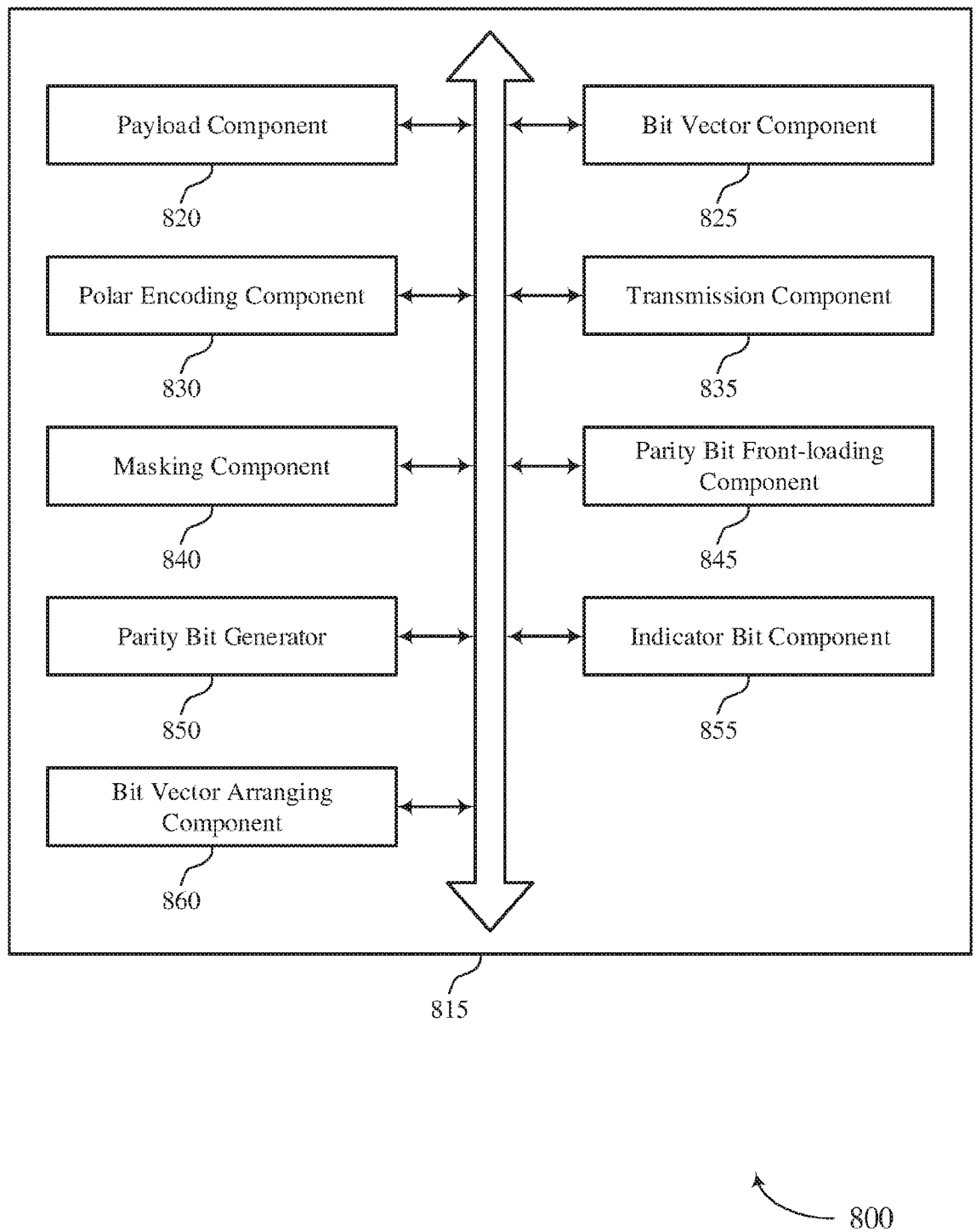
FIG. 8 shows a block diagram of an encoder polar coding module that supports polar coding techniques for blind detection of different payload sizes in accordance with aspects of the present disclosure.

FIG. 8 shows a block diagram 800 of an encoder polar coding module 815 that supports polar coding techniques for blind detection of different payload sizes in accordance with aspects of the present disclosure. The encoder polar coding module 815 may be an example of aspects of an encoder polar coding module 615, an encoder polar coding module 715, or an encoder polar coding module 915 described with reference to FIGS. 6, 7, and 9. The encoder polar coding module 815 may include payload component 820, bit vector component 825, polar encoding component 830, transmission component 835, masking component 840, parity bit front-loading component 845, parity bit generator 850, indicator bit component 855, and bit vector arranging component 860. Each of these modules may communicate, directly or indirectly, with one another (e.g., via one or more buses).

Payload component 820 may identify a set of payload bits of a payload for encoding. Bit vector component 825 may determine a bit vector including the set of payload bits, where at least one bit or a bit order of the bit vector is based on a size of the payload. In some cases, the bit vector includes the set of payload bits and a set of parity bits associated with the set of payload bits.

Polar encoding component 830 may generate a polar-encoded codeword based on the bit vector. Transmission component 835 may transmit the codeword.

Masking component 840 may determine a masking vector corresponding to the size of the payload, and may scramble the set of payload bits, a set of parity bits associated with the set of payload bits, a set of frozen bits, or a combination thereof with the masking vector. In some cases, scrambling the set of payload bits, the set of parity bits, the set of frozen bits, or the combination thereof with the masking vector includes an XOR operation.

In some cases, the bit vector may include a set of parity bits. Parity bit front-loading component 845 may position at least one bit of the set of parity bits in a lowest index of the bit vector, where the set of payload bits are positioned in higher indices of the bit vector. In some cases, parity bit front-loading component 845 may assign the set of payload bits and the set of parity bits to a set of information bit channels of a polar code, where the at least one bit of the set of parity bits is assigned to a least reliable channel of the set of information bit channels.

Parity bit generator 850 may apply a parity function to the set of payload bits to generate the set of parity bits. In some cases, the set of parity bits includes a set of CRC bits.

Indicator bit component 855 may append an initial bit to the bit vector, where the initial bit includes an opposite bit value to a default frozen bit value. In some cases, the initial bit indicates a message type associated with the payload.

Bit vector arranging component 860 may arrange the set of payload bits, a set of parity bits associated with the set of payload bits, a set of frozen bits, or a combination thereof so that an initial bit of the bit vector includes an opposite bit value to a default frozen bit value.

Figure 9:
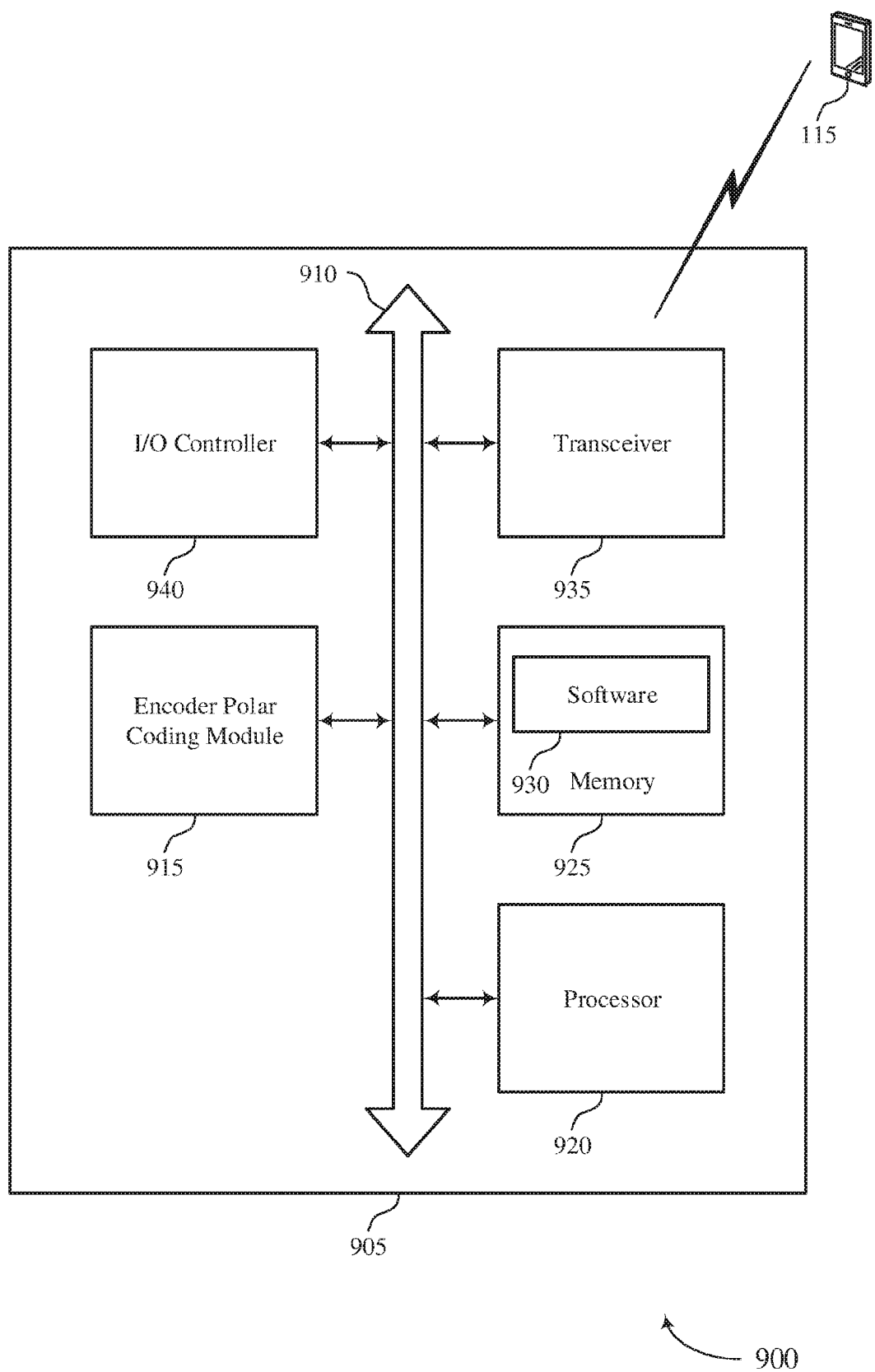
FIG. 9 shows a block diagram of a system including a device that supports polar coding techniques for blind detection of different payload sizes in accordance with aspects of the present disclosure.

FIG. 9 shows a block diagram of a system 900 including a device 905 that supports polar coding techniques for blind detection of different payload sizes in accordance with aspects of the present disclosure. Device 905 may be an example of or include the components of wireless device 605, wireless device 705, a base station 105, a UE 115, or an encoder as described above, e.g., with reference to FIGS. 1, 2, 6, and 7. Device 905 may include components for bi-directional voice and data communications including components for transmitting and receiving communications, including encoder polar coding module 915, processor 920, memory 925, software 930, transceiver 935, and I/O controller 940. These components may be in electronic communication via one or more buses (e.g., bus 910).

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting polar coding techniques for blind detection of different payload sizes).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware or software operation such as the interaction with peripheral components or devices.

Software 930 may include code to implement aspects of the present disclosure, including code to support polar coding techniques for blind detection of different payload sizes. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

I/O controller 940 may manage input and output signals for device 905. I/O controller 940 may also manage peripherals not integrated into device 905. In some cases, I/O controller 940 may represent a physical connection or port to an external peripheral. In some cases, I/O controller 940 may utilize an operating system such as iOS®, ANDROID®, MS-DOS®, MS-WINDOWS®, OS/2®, UNIX®, LINUX®, or another known operating system. In other cases, I/O controller 940 may represent or interact with a modem, a keyboard, a mouse, a touchscreen, or a similar device. In some cases, I/O controller 940 may be implemented as part of a processor. In some cases, a user may interact with device 905 via I/O controller 940 or via hardware components controlled by I/O controller 940.

Figure 10:
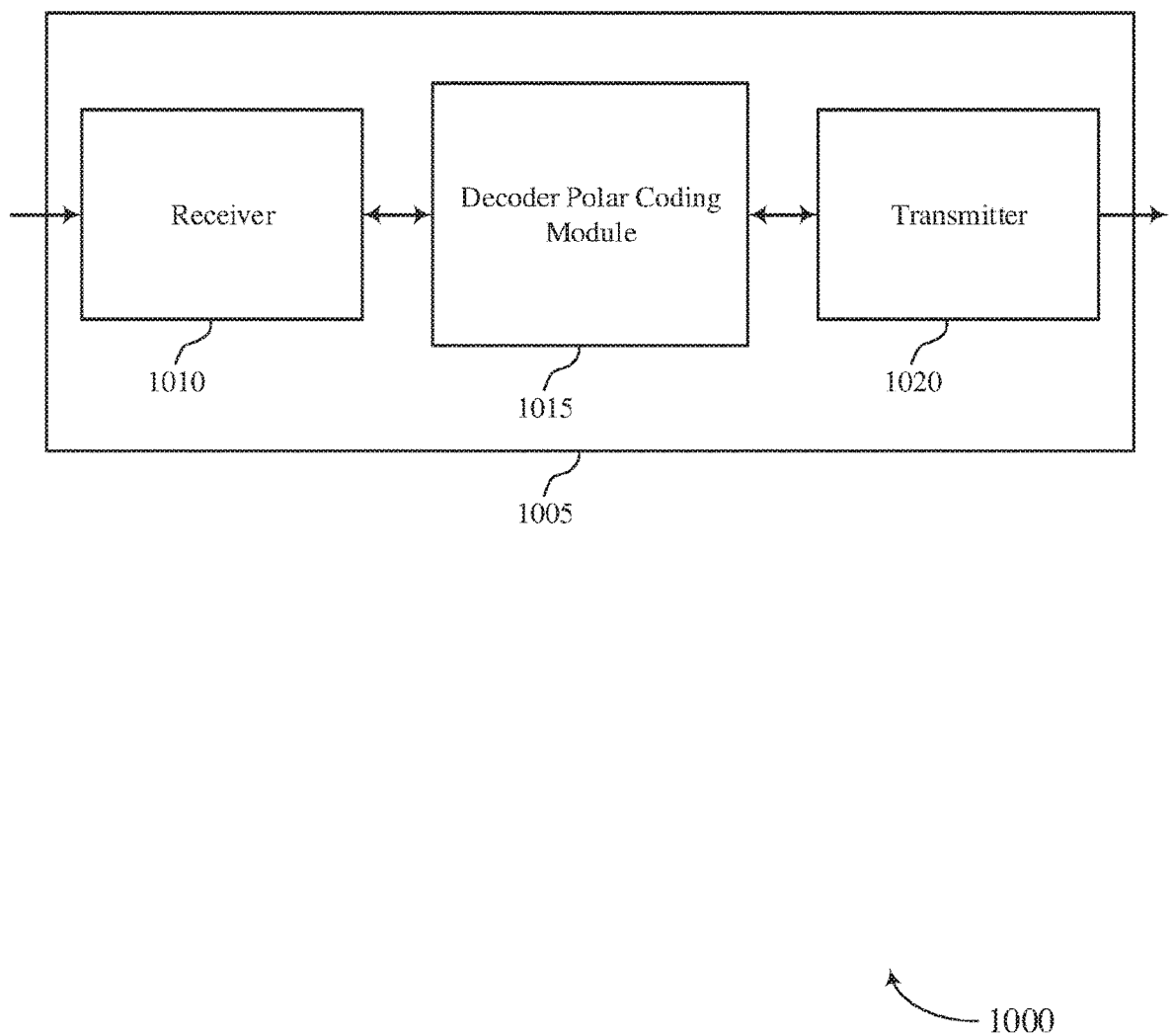
FIGS. 10 and 11 show block diagrams of wireless devices that support polar coding techniques for blind detection of different payload sizes in accordance with aspects of the present disclosure.

FIG. 10 shows a block diagram 1000 of a wireless device 1005 that supports polar coding techniques for blind detection of different payload sizes in accordance with aspects of the present disclosure. Wireless device 1005 may be an example of aspects of a base station 105 or a UE 115, including a decoder, as described above with reference to FIGS. 1 and 2. Wireless device 1005 may include receiver 1010, decoder polar coding module 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to polar coding techniques for blind detection of different payload sizes, etc.). Information may be passed on to other components of the device. The receiver 1010 may be an example of aspects of the transceiver 1335 described with reference to FIG. 13. The receiver 1010 may utilize a single antenna or a set of antennas.

Decoder polar coding module 1015 may be an example of aspects of the decoder polar coding module 1315 described with reference to FIG. 13. Decoder polar coding module 1015 and/or at least some of its various sub-components may be implemented in hardware, software executed by a processor, firmware, or any combination thereof. If implemented in software executed by a processor, the functions of the decoder polar coding module 1015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The decoder polar coding module 1015 and/or at least some of its various sub-components may be physically located at various positions, including being distributed such that portions of functions are implemented at different physical locations by one or more physical devices. In some examples, decoder polar coding module 1015 and/or at least some of its various sub-components may be a separate and distinct component in accordance with aspects of the present disclosure. In other examples, decoder polar coding module 1015 and/or at least some of its various sub-components may be combined with one or more other hardware components, including but not limited to an I/O component, a transceiver, a network server, another computing device, one or more other components described in the present disclosure, or a combination thereof in accordance with aspects of the present disclosure.

Decoder polar coding module 1015 may receive a polar-encoded codeword, the polar-encoded codeword generated based on a bit vector including a set of payload bits of a payload, and perform a blind decoding process on the polar-encoded codeword. The blind decoding process may include determining a size of the payload based on at least one LLR associated with the bit vector, decoding the polar-encoded codeword to obtain the bit vector based on the determined size of the payload, and parsing the bit vector to obtain the set of payload bits based on the determined size of the payload.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1335 described with reference to FIG. 13. The transmitter 1020 may utilize a single antenna or a set of antennas.

Figure 11:
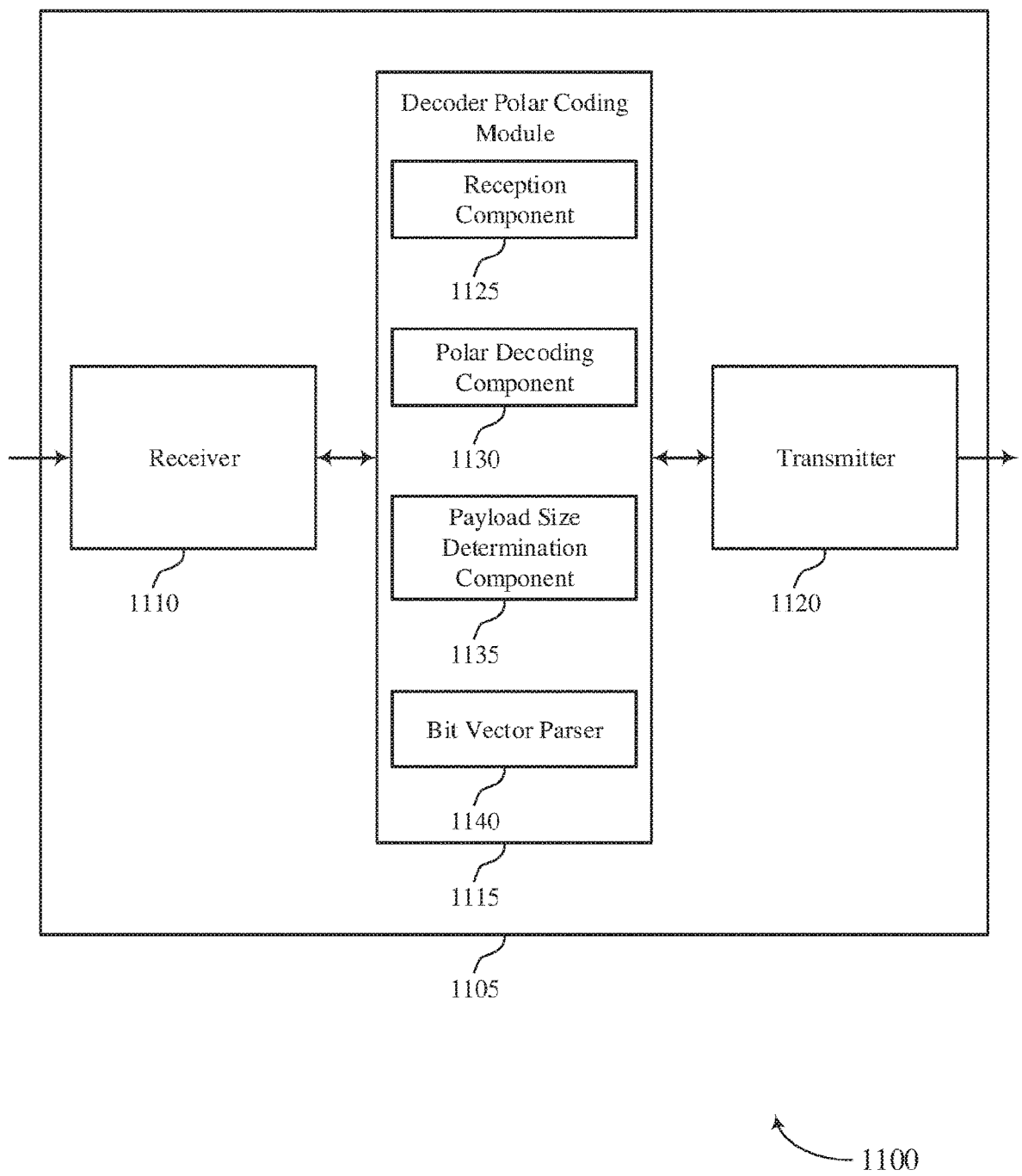

FIG. 11 shows a block diagram 1100 of a wireless device 1105 that supports polar coding techniques for blind detection of different payload sizes in accordance with aspects of the present disclosure. Wireless device 1105 may be an example of aspects of a wireless device 1005, a base station 105, a UE 115, or a decoder as described with reference to FIGS. 1, 2, and 10. Wireless device 1105 may include receiver 1110, decoder polar coding module 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to polar coding techniques for blind detection of different payload sizes, etc.). Information may be passed on to other components of the device. The receiver 1110 may be an example of aspects of the transceiver 1335 described with reference to FIG. 13. The receiver 1110 may utilize a single antenna or a set of antennas.

Decoder polar coding module 1115 may be an example of aspects of the decoder polar coding module 1315 described with reference to FIG. 13. Decoder polar coding module 1115 may also include reception component 1125, polar decoding component 1130, payload size determination component 1135, and bit vector parser 1140.

Reception component 1125 may receive a codeword encoded using a polar code, the codeword generated based on a bit vector including a set of payload bits of a payload.

Polar decoding component 1130 may perform a blind decoding process on the codeword. For example, payload size determination component 1135 may determine a size of the payload based on at least one LLR associated with the bit vector. Polar decoding component 1130 may decode the codeword to obtain the bit vector based on the determined size of the payload. Bit vector parser 1140 may parse the bit vector to obtain the set of payload bits based on the determined size of the payload.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Figure 12:
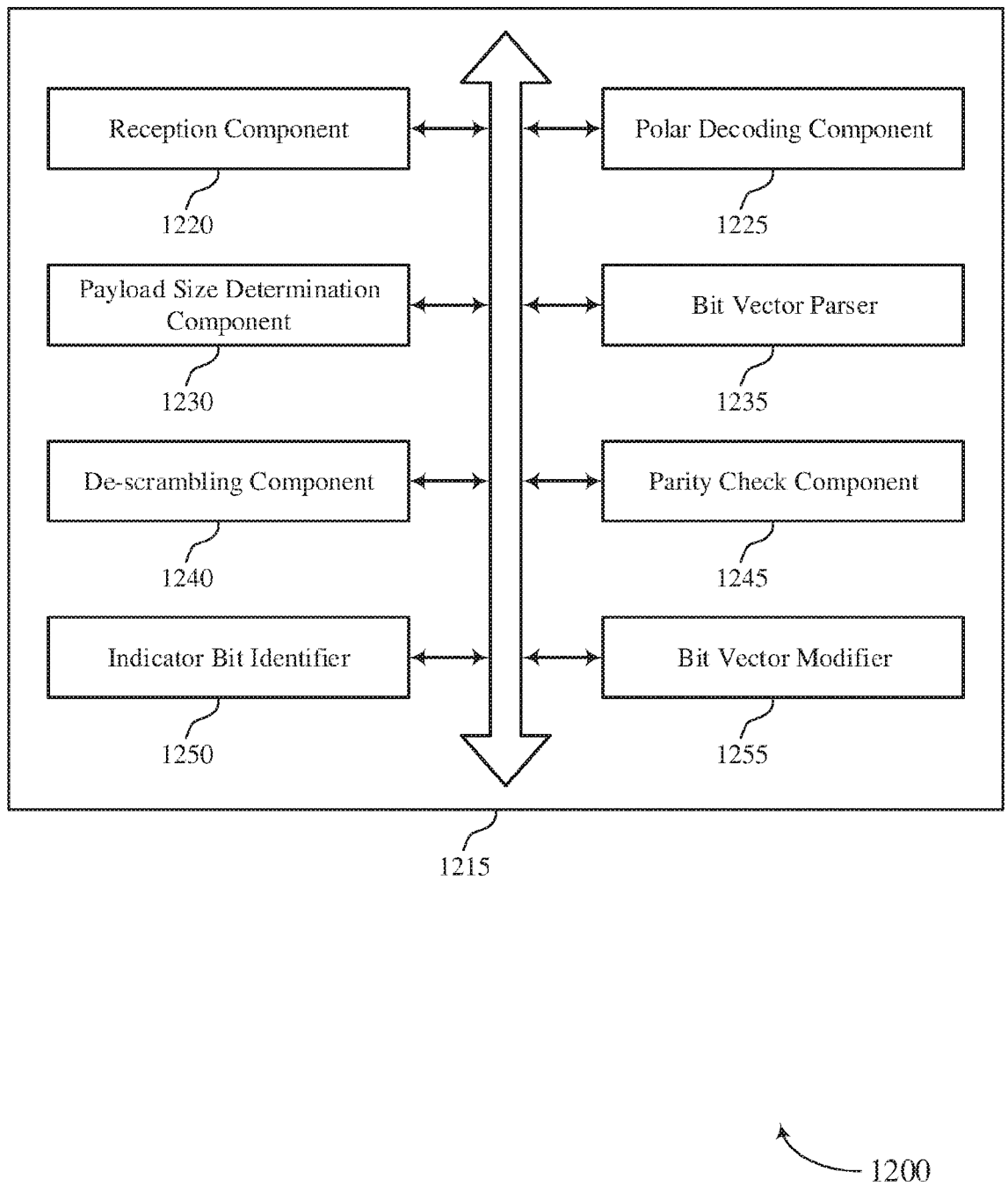
FIG. 12 shows a block diagram of a decoder polar coding module that supports polar coding techniques for blind detection of different payload sizes in accordance with aspects of the present disclosure.

FIG. 12 shows a block diagram 1200 of a decoder polar coding module 1215 that supports polar coding techniques for blind detection of different payload sizes in accordance with aspects of the present disclosure. The decoder polar coding module 1215 may be an example of aspects of a decoder polar coding module described with reference to FIGS. 10, 11, and 13. The decoder polar coding module 1215 may include reception component 1220, polar decoding component 1225, payload size determination component 1230, bit vector parser 1235, de-scrambling component 1240, parity check component 1245, indicator bit identifier 1250, and bit vector modifier 1255. Each of these modules may communicate, directly or indirectly, with one another (e.g., via one or more buses).

Reception component 1220 may receive a polar-encoded codeword, the codeword generated based on a bit vector including a set of payload bits of a payload.

Polar decoding component 1225 may perform a blind decoding process on the codeword. For example, polar decoding component 1225 may decode the codeword to obtain the bit vector based on the determined size of the payload.

Payload size determination component 1230 may determine a size of the payload based on at least one LLR associated with the bit vector. Bit vector parser 1235 may parse the bit vector to obtain the set of payload bits based on the determined size of the payload.

De-scrambling component 1240 may perform one or more de-scrambling operations on at least one bit decision for the at least one LLR, where each de-scrambling operation utilizes a masking vector corresponding to a payload size. In some cases, de-scrambling component 1240 may identify a successful de-scrambling operation based on comparing a set of de-scrambled parity bits to a set of de-scrambled payload bits, and may determine the size of the payload as the payload size corresponding to the masking vector for the successful de-scrambling operation. In some cases, the de-scrambling operation includes an inverse XOR operation.

In some cases, the codeword is further generated based on a set of parity bits, where the set of payload bits and the set of parity bits are assigned to a set of information bit channels. In these cases, determining the size of the payload may include parity check component 1245 performing one or more parity checks on at least one bit decision for the at least one LLR using the set of parity bits, where a positioning of the set of parity bits within the codeword for each parity check indicates a corresponding payload size. In some cases, parity check component 1245 may identify a successful parity check based on the set of parity bits and the at least one bit decision for the at least one LLR, and may determine the size of the payload as the corresponding payload size indicated by the positioning of the set of parity bits resulting in the successful parity check. In some cases, at least one bit of the set of parity bits is assigned to a least reliable channel of the set of information bit channels. In some cases, the set of parity bits includes a set of CRC bits.

In some cases, determining the size of the payload includes indicator bit identifier 1250 identifying a least reliable bit channel of the codeword with an LLR indicating an opposite bit value to a default frozen bit value. Indicator bit identifier 1250 may determine the size of the payload based on the identified least reliable bit channel.

In some cases, bit vector modifier 1255 may remove an initial bit corresponding to the LLR indicating the opposite bit value to the default frozen bit value. In other cases, bit vector modifier 1255 may reorder bits of the bit vector based on the LLR indicating the opposite bit value to the default frozen bit value.

Figure 13:
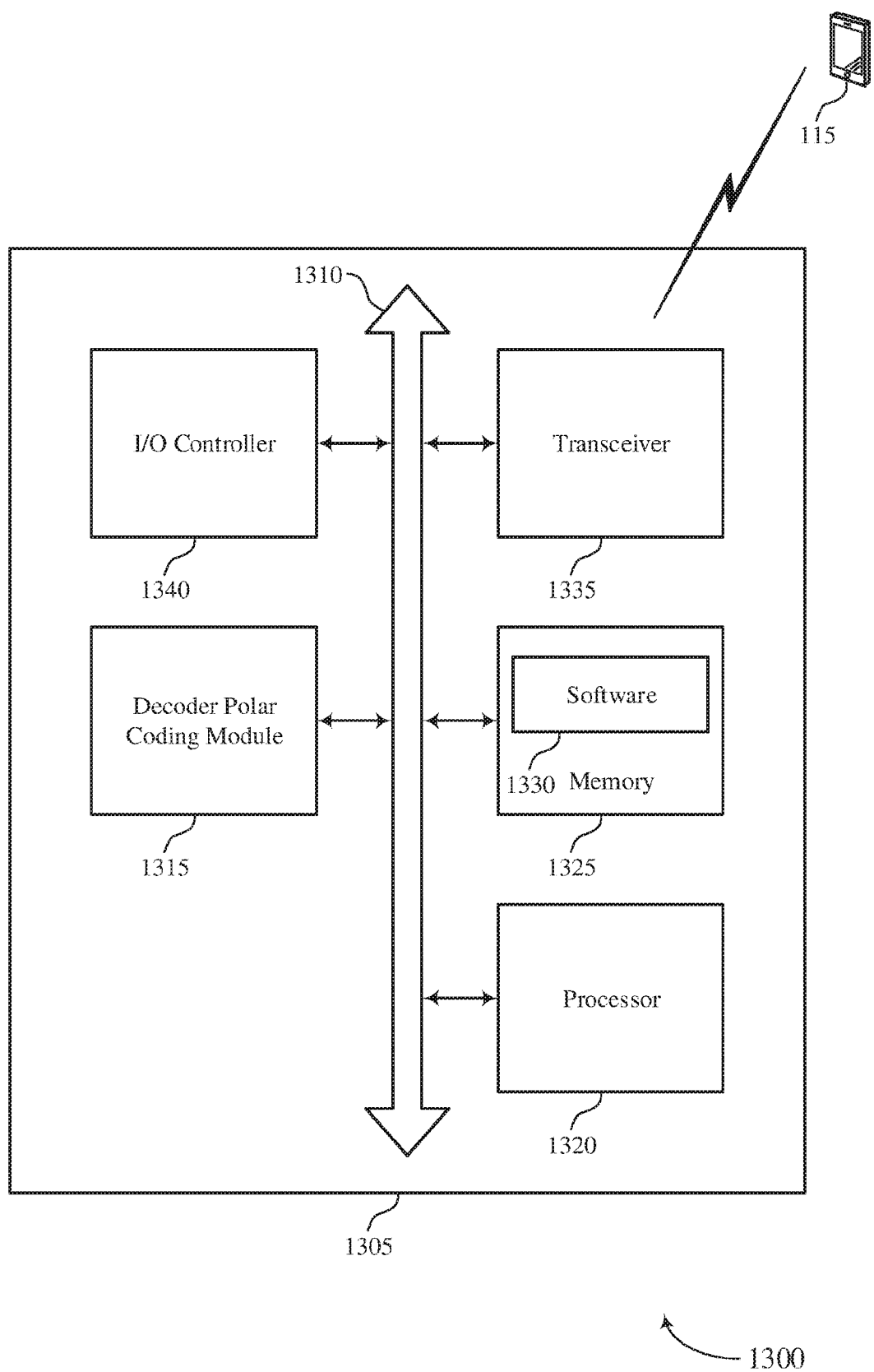
FIG. 13 illustrates a block diagram of a system including a decoder that supports polar coding techniques for blind detection of different payload sizes in accordance with aspects of the present disclosure.

FIG. 13 shows a block diagram of a system 1300 including a device 1305 that supports polar coding techniques for blind detection of different payload sizes in accordance with aspects of the present disclosure. Device 1305 may be an example of or include the components of wireless device 1005, wireless device 1105, a base station 105, a UE 115, or a decoder as described above, e.g., with reference to FIGS. 1, 2, 10, and 11. Device 1305 may include components for bi-directional voice and data communications including components for transmitting and receiving communications, including decoder polar coding module 1315, processor 1320, memory 1325, software 1330, transceiver 1335, and I/O controller 1340. These components may be in electronic communication via one or more buses (e.g., bus 1310).

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting polar coding techniques for blind detection of different payload sizes).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware or software operation such as the interaction with peripheral components or devices.

Software 1330 may include code to implement aspects of the present disclosure, including code to support polar coding techniques for blind detection of different payload sizes. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

I/O controller 1340 may manage input and output signals for device 1305. I/O controller 1340 may also manage peripherals not integrated into device 1305. In some cases, I/O controller 1340 may represent a physical connection or port to an external peripheral. In some cases, I/O controller 1340 may utilize an operating system such as iOS®, ANDROID®, MS-DOS®, MS-WINDOWS®, OO/2®, UNIX®, LINUX®, or another known operating system. In other cases, I/O controller 1340 may represent or interact with a modem, a keyboard, a mouse, a touchscreen, or a similar device. In some cases, I/O controller 1340 may be implemented as part of a processor. In some cases, a user may interact with device 1305 via I/O controller 1340 or via hardware components controlled by I/O controller 1340.

Figure 14:
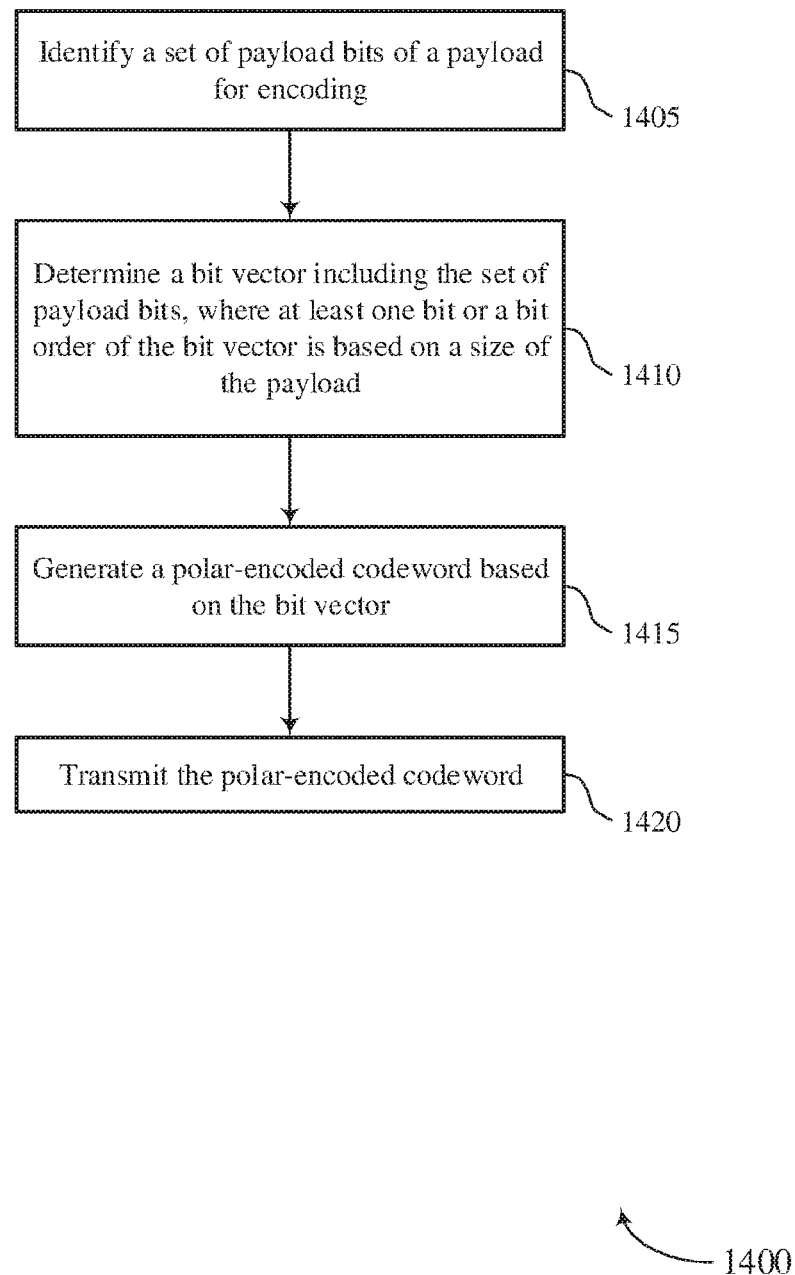
FIGS. 14 through 19 show flowcharts illustrating methods for polar coding techniques for blind detection of different payload sizes in accordance with aspects of the present disclosure.

FIG. 14 shows a flowchart illustrating a method 1400 for polar coding techniques for blind detection of different payload sizes in accordance with aspects of the present disclosure. The operations of method 1400 may be implemented by an encoder or its components as described herein. The encoder may be a component of a wireless device, such as a base station 105 or a UE 115. For example, the operations of method 1400 may be performed by an encoder polar coding module as described with reference to FIGS. 6 through 9. In some examples, an encoder may execute a set of codes to control the functional elements of the device to perform the functions described below. Additionally or alternatively, the encoder may perform aspects of the functions described below using special-purpose hardware.

At 1405 the encoder may identify a plurality of payload bits of a payload for encoding. The operations of 1405 may be performed according to the methods described herein. In certain examples, aspects of the operations of 1405 may be performed by a payload component as described with reference to FIGS. 6 through 9.

At 1410 the encoder may determine a bit vector comprising the plurality of payload bits, wherein at least one bit or a bit order of the bit vector is based at least in part on a size of the payload. The operations of 1410 may be performed according to the methods described herein. In certain examples, aspects of the operations of 1410 may be performed by a bit vector component as described with reference to FIGS. 6 through 9.

At 1415 the encoder may generate a polar-encoded codeword based at least in part on the bit vector. The operations of 1415 may be performed according to the methods described herein. In certain examples, aspects of the operations of 1415 may be performed by a polar encoding component as described with reference to FIGS. 6 through 9.

At 1420 the encoder may transmit the polar-encoded codeword. The operations of 1420 may be performed according to the methods described herein. In certain examples, aspects of the operations of 1420 may be performed by a transmission component as described with reference to FIGS. 6 through 9.

Figure 15:
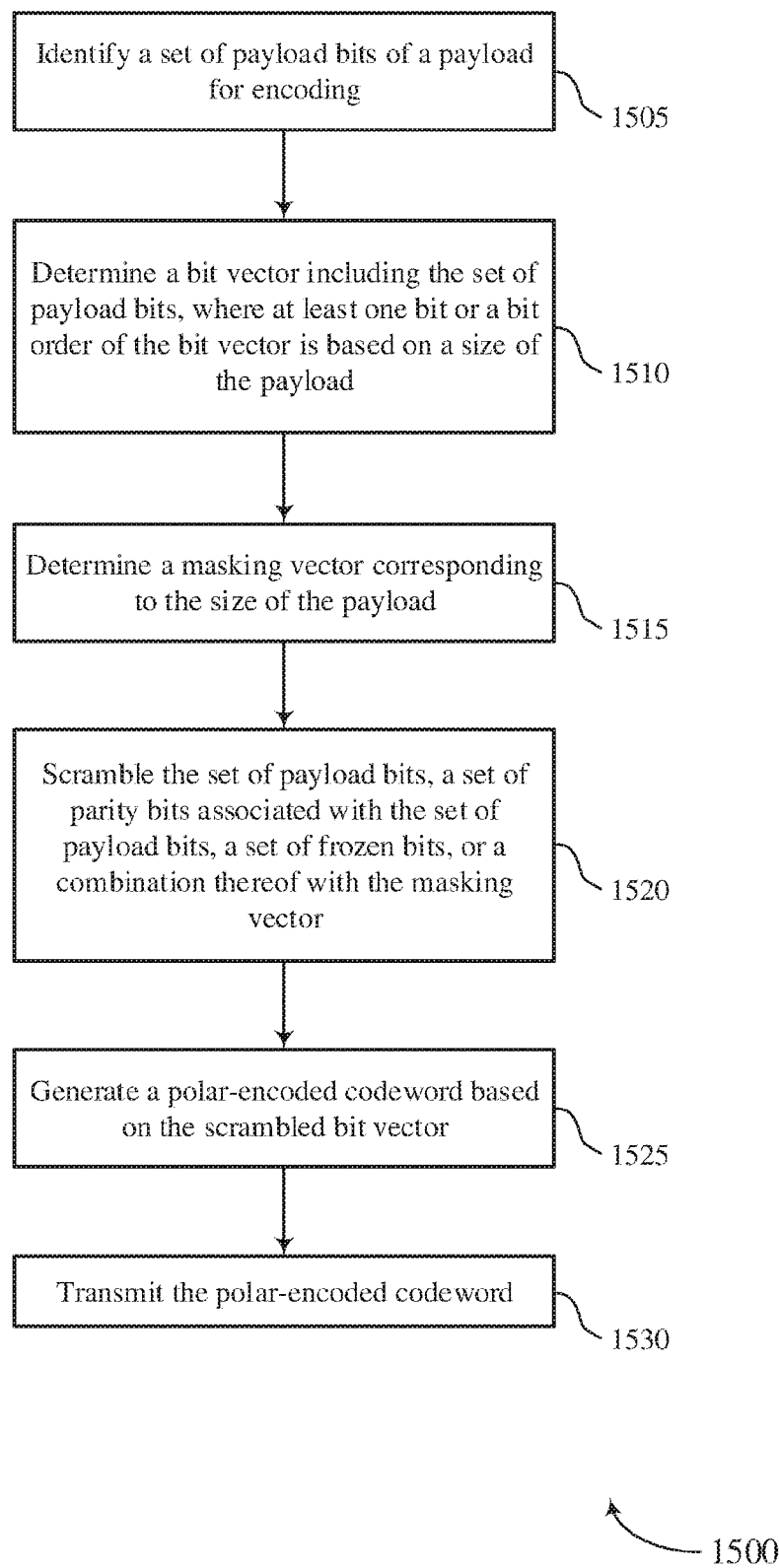

FIG. 15 shows a flowchart illustrating a method 1500 for polar coding techniques for blind detection of different payload sizes in accordance with aspects of the present disclosure. The operations of method 1500 may be implemented by an encoder or its components as described herein. The encoder may be a component of a wireless device, such as a base station 105 or a UE 115. For example, the operations of method 1500 may be performed by an encoder polar coding module as described with reference to FIGS. 6 through 9. In some examples, an encoder may execute a set of codes to control the functional elements of the device to perform the functions described below. Additionally or alternatively, the encoder may perform aspects of the functions described below using special-purpose hardware.

At 1505 the encoder may identify a plurality of payload bits of a payload for encoding. The operations of 1505 may be performed according to the methods described herein. In certain examples, aspects of the operations of 1505 may be performed by a payload component as described with reference to FIGS. 6 through 9.

At 1510 the encoder may determine a bit vector comprising the plurality of payload bits, wherein at least one bit or a bit order of the bit vector is based at least in part on a size of the payload. The operations of 1510 may be performed according to the methods described herein. In certain examples, aspects of the operations of 1510 may be performed by a bit vector component as described with reference to FIGS. 6 through 9.

At 1515 the encoder may determine a masking vector corresponding to the size of the payload. The operations of 1515 may be performed according to the methods described herein. In certain examples, aspects of the operations of 1515 may be performed by a masking component as described with reference to FIGS. 6 through 9.

At 1520 the encoder may scramble the plurality of payload bits, a plurality of parity bits associated with the plurality of payload bits, a plurality of frozen bits, or a combination thereof with the masking vector. The operations of 1520 may be performed according to the methods described herein. In certain examples, aspects of the operations of 1520 may be performed by a masking component as described with reference to FIGS. 6 through 9.

At 1525 the encoder may generate a polar-encoded codeword based at least in part on the bit vector. The operations of 1525 may be performed according to the methods described herein. In certain examples, aspects of the operations of 1525 may be performed by a polar encoding component as described with reference to FIGS. 6 through 9.

At 1530 the encoder may transmit the polar-encoded codeword. The operations of 1530 may be performed according to the methods described herein. In certain examples, aspects of the operations of 1530 may be performed by a transmission component as described with reference to FIGS. 6 through 9.

Figure 16:
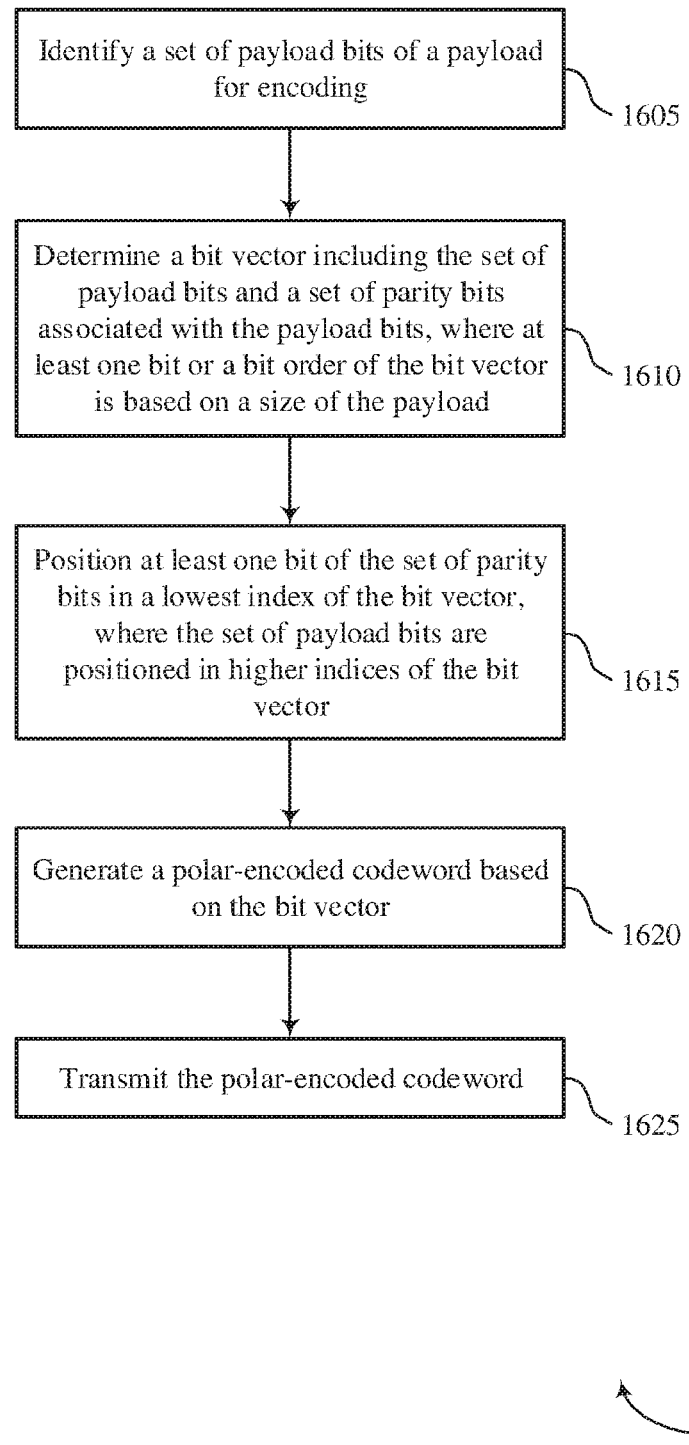

FIG. 16 shows a flowchart illustrating a method 1600 for polar coding techniques for blind detection of different payload sizes in accordance with aspects of the present disclosure. The operations of method 1600 may be implemented by an encoder or its components as described herein. The encoder may be a component of a wireless device, such as a base station 105 or a UE 115. For example, the operations of method 1600 may be performed by an encoder polar coding module as described with reference to FIGS. 6 through 9. In some examples, an encoder may execute a set of codes to control the functional elements of the device to perform the functions described below. Additionally or alternatively, the encoder may perform aspects of the functions described below using special-purpose hardware.

At 1605 the encoder may identify a plurality of payload bits of a payload for encoding. The operations of 1605 may be performed according to the methods described herein. In certain examples, aspects of the operations of 1605 may be performed by a payload component as described with reference to FIGS. 6 through 9.

At 1610 the encoder may determine a bit vector comprising the plurality of payload bits and a plurality of parity bits associated with the payload bits, wherein at least one bit or a bit order of the bit vector is based at least in part on a size of the payload. The operations of 1610 may be performed according to the methods described herein. In certain examples, aspects of the operations of 1610 may be performed by a bit vector component as described with reference to FIGS. 6 through 9.

At 1615 the encoder may position at least one bit of the plurality of parity bits in a lowest index of the bit vector, wherein the plurality of payload bits are positioned in higher indices of the bit vector. The operations of 1615 may be performed according to the methods described herein. In certain examples, aspects of the operations of 1615 may be performed by a parity bit front-loading component as described with reference to FIGS. 6 through 9.

At 1620 the encoder may generate a polar-encoded codeword based at least in part on the bit vector. The operations of 1620 may be performed according to the methods described herein. In certain examples, aspects of the operations of 1620 may be performed by a polar encoding component as described with reference to FIGS. 6 through 9.

At 1625 the encoder may transmit the polar-encoded codeword. The operations of 1625 may be performed according to the methods described herein. In certain examples, aspects of the operations of 1625 may be performed by a transmission component as described with reference to FIGS. 6 through 9.

Figure 17:
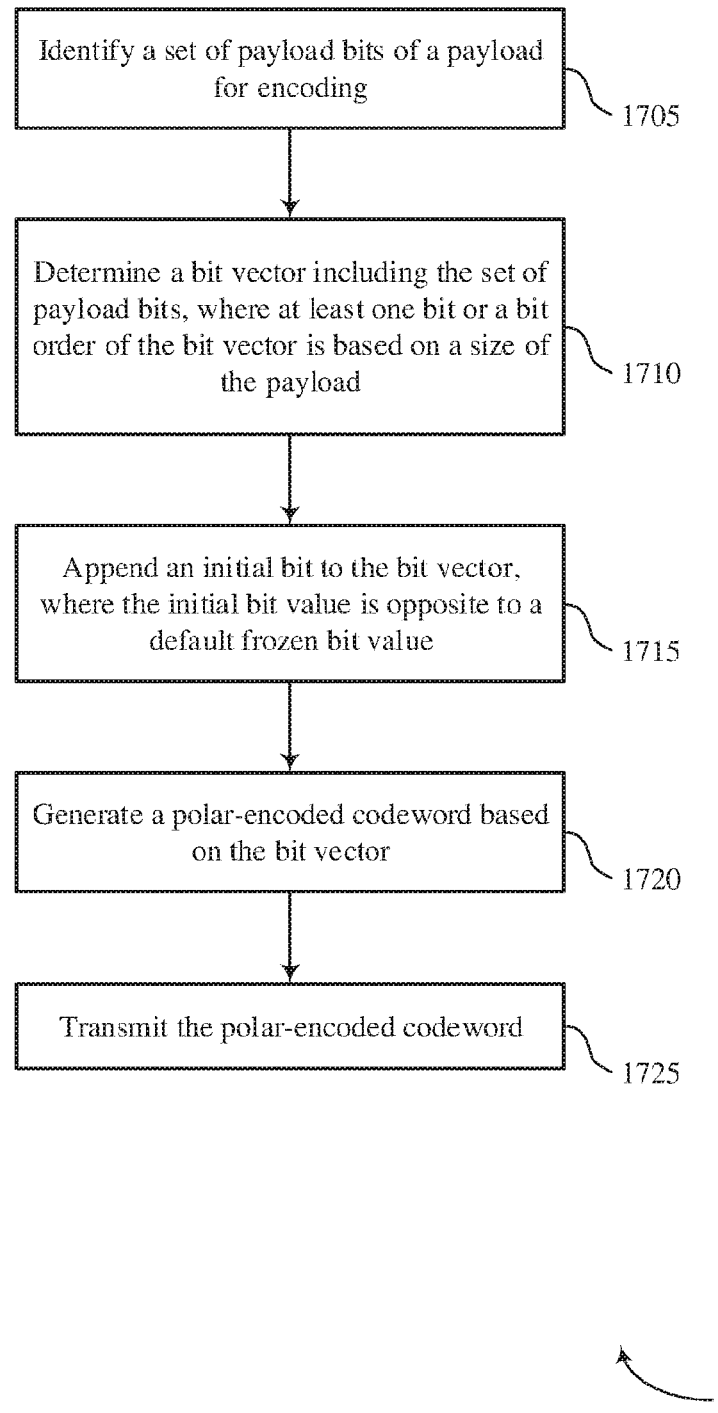

FIG. 17 shows a flowchart illustrating a method 1700 for polar coding techniques for blind detection of different payload sizes in accordance with aspects of the present disclosure. The operations of method 1700 may be implemented by an encoder or its components as described herein. The encoder may be a component of a wireless device, such as a base station 105 or a UE 115. For example, the operations of method 1700 may be performed by an encoder polar coding module as described with reference to FIGS. 6 through 9. In some examples, an encoder may execute a set of codes to control the functional elements of the device to perform the functions described below. Additionally or alternatively, the encoder may perform aspects of the functions described below using special-purpose hardware.

At 1705 the encoder may identify a plurality of payload bits of a payload for encoding. The operations of 1705 may be performed according to the methods described herein. In certain examples, aspects of the operations of 1705 may be performed by a payload component as described with reference to FIGS. 6 through 9.

At 1710 the encoder may determine a bit vector comprising the plurality of payload bits, wherein at least one bit or a bit order of the bit vector is based at least in part on a size of the payload. The operations of 1710 may be performed according to the methods described herein. In certain examples, aspects of the operations of 1710 may be performed by a bit vector component as described with reference to FIGS. 6 through 9.

At 1715 the encoder may append an initial bit to the bit vector, wherein the initial bit comprises an opposite bit value to a default frozen bit value. The operations of 1715 may be performed according to the methods described herein. In certain examples, aspects of the operations of 1715 may be performed by an indicator bit component as described with reference to FIGS. 6 through 9.

At 1720 the encoder may generate a polar-encoded codeword based at least in part on the bit vector. The operations of 1720 may be performed according to the methods described herein. In certain examples, aspects of the operations of 1720 may be performed by a polar encoding component as described with reference to FIGS. 6 through 9.

At 1725 the encoder may transmit the polar-encoded codeword. The operations of 1725 may be performed according to the methods described herein. In certain examples, aspects of the operations of 1725 may be performed by a transmission component as described with reference to FIGS. 6 through 9.

Figure 18:
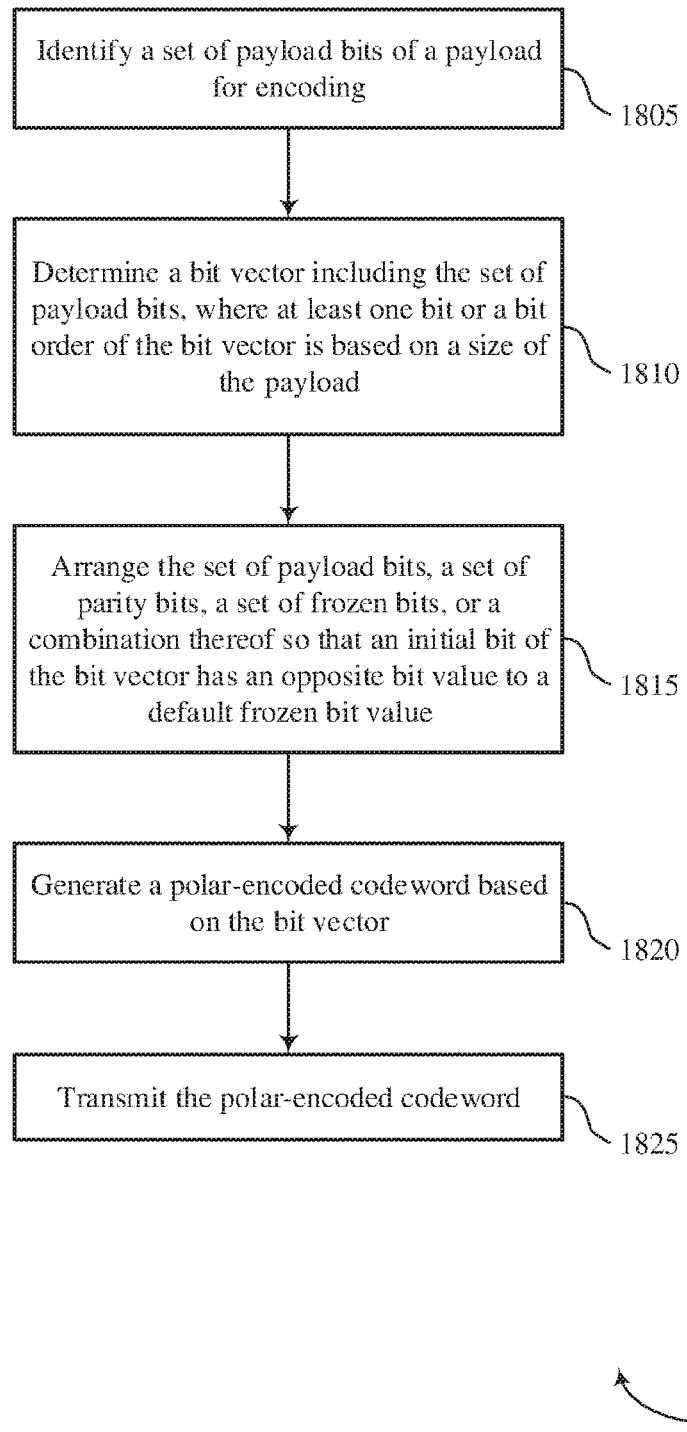

FIG. 18 shows a flowchart illustrating a method 1800 for polar coding techniques for blind detection of different payload sizes in accordance with aspects of the present disclosure. The operations of method 1800 may be implemented by an encoder or its components as described herein. The encoder may be a component of a wireless device, such as a base station 105 or a UE 115. For example, the operations of method 1800 may be performed by an encoder polar coding module as described with reference to FIGS. 6 through 9. In some examples, an encoder may execute a set of codes to control the functional elements of the device to perform the functions described below. Additionally or alternatively, the encoder may perform aspects of the functions described below using special-purpose hardware.

At 1805 the encoder may identify a plurality of payload bits of a payload for encoding. The operations of 1805 may be performed according to the methods described herein. In certain examples, aspects of the operations of 1805 may be performed by a payload component as described with reference to FIGS. 6 through 9.

At 1810 the encoder may determine a bit vector comprising the plurality of payload bits, wherein at least one bit or a bit order of the bit vector is based at least in part on a size of the payload. The operations of 1810 may be performed according to the methods described herein. In certain examples, aspects of the operations of 1810 may be performed by a bit vector component as described with reference to FIGS. 6 through 9.

At 1815 the encoder may arrange the plurality of payload bits, a plurality of parity bits associated with the plurality of payload bits, a plurality of frozen bits, or a combination thereof so that an initial bit of the bit vector comprises an opposite bit value to a default frozen bit value. The operations of 1815 may be performed according to the methods described herein. In certain examples, aspects of the operations of 1815 may be performed by a bit vector arranging component as described with reference to FIGS. 6 through 9.

At 1820 the encoder may generate a polar-encoded codeword based at least in part on the bit vector. The operations of 1820 may be performed according to the methods described herein. In certain examples, aspects of the operations of 1820 may be performed by a polar encoding component as described with reference to FIGS. 6 through 9.

At 1825 the encoder may transmit the polar-encoded codeword. The operations of 1825 may be performed according to the methods described herein. In certain examples, aspects of the operations of 1825 may be performed by a transmission component as described with reference to FIGS. 6 through 9.

Figure 19:
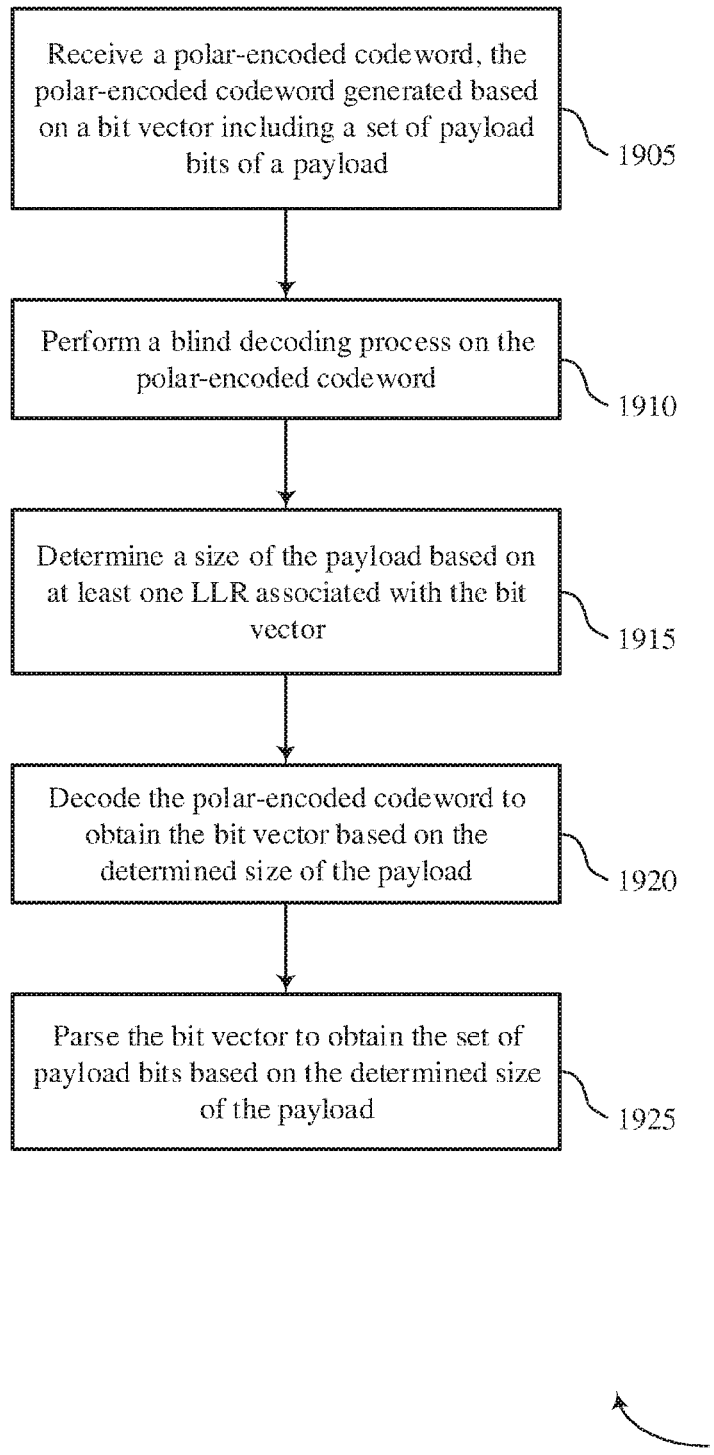

FIG. 19 shows a flowchart illustrating a method 1900 for polar coding techniques for blind detection of different payload sizes in accordance with aspects of the present disclosure. The operations of method 1900 may be implemented by a decoder or its components as described herein. The decoder may be a component of a wireless device, such as a base station 105 or a UE 115. For example, the operations of method 1900 may be performed by a decoder polar coding module as described with reference to FIGS. 10 through 13. In some examples, a decoder may execute a set of codes to control the functional elements of the device to perform the functions described below. Additionally or alternatively, the decoder may perform aspects of the functions described below using special-purpose hardware.

At 1905 the decoder may receive a polar-encoded codeword, the polar-encoded codeword generated based at least in part on a bit vector comprising a plurality of payload bits of a payload. The operations of 1905 may be performed according to the methods described herein. In certain examples, aspects of the operations of 1905 may be performed by a reception component as described with reference to FIGS. 10 through 13.

At 1910 the decoder may perform a blind decoding process on the polar-encoded codeword. In some cases, the blind decoding process may include the determining, decoding and parsing steps described below. The operations of 1910 may be performed according to the methods described herein. In certain examples, aspects of the operations of 1910 may be performed by a polar decoding component as described with reference to FIGS. 10 through 13.

At 1915 the decoder may determine a size of the payload based at least in part on at least one LLR associated with the bit vector. The operations of 1915 may be performed according to the methods described herein. In certain examples, aspects of the operations of 1915 may be performed by a payload size determination component as described with reference to FIGS. 10 through 13.

At 1920 the decoder may decode the polar-encoded codeword to obtain the bit vector based at least in part on the determined size of the payload. The operations of 1920 may be performed according to the methods described herein. In certain examples, aspects of the operations of 1920 may be performed by a polar decoding component as described with reference to FIGS. 10 through 13.

At 1925 the decoder may parse the bit vector to obtain the plurality of payload bits based at least in part on the determined size of the payload. The operations of 1925 may be performed according to the methods described herein. In certain examples, aspects of the operations of 1925 may be performed by a bit vector parser as described with reference to FIGS. 10 through 13.

In some examples, aspects from two or more of the described methods may be combined. It should be noted that the described methods are just example implementations, and that the operations of the described methods may be rearranged or otherwise modified such that other implementations are possible.

Techniques described herein may be used for various wireless communications systems such as code division multiple access (CDMA), time division multiple access (TDMA), frequency division multiple access (FDMA), orthogonal FDMA (OFDMA), single carrier frequency division multiple access (SC-FDMA), and other systems. A CDMA system may implement a radio technology such as CDMA2000, UTRA, etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), E-UTRA, Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples.

A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a FPGA or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates an inclusive list such that, for example, a phrase referring to "at least one of" a list of items refers to any combination of those items, including single members. As an example, "at least one of: A, B, or C" is intended to cover A, B, C, A-B, A-C, B-C, and A-B-C, as well as any combination with multiples of the same element (e.g., A-A A-A-A, A-A-B, A-A-C, A-B-B, A-C-C, B-B, B-B-B, B-B-C, C-C, and C-C-C or any other ordering of A, B, and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, the phrase "based on" shall not be construed as a reference to a closed set of conditions. For example, an exemplary feature that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   identifying a plurality of payload bits of a payload for encoding;
   scrambling the plurality of payload bits, a plurality of parity bits associated with the plurality of payload bits, a plurality of frozen bits, or a combination thereof with a masking vector, wherein the masking vector corresponds to a size of the payload;
   generating a polar-encoded codeword based at least in part on a bit vector comprising the plurality of payload bits, wherein at least one bit or a bit order of the bit vector is based at least in part on the size of the payload; and
   transmitting the polar-encoded codeword.

2. The method of claim 1, wherein scrambling the plurality of payload bits, the plurality of parity bits, the plurality of frozen bits, or the combination thereof with the masking vector comprises an exclusive or (XOR) operation.

3. The method of claim 1, wherein the bit vector comprises the plurality of payload bits and the plurality of parity bits associated with the plurality of payload bits.

4. The method of claim 3, wherein determining the bit vector comprises:
   positioning at least one bit of the plurality of parity bits in a lowest index of the bit vector, wherein the plurality of payload bits are positioned in higher indices of the bit vector.

5. The method of claim 4, wherein generating the polar-encoded codeword comprises:
   assigning the plurality of payload bits and the plurality of parity bits to a plurality of information bit channels of a polar code, wherein the at least one bit of the plurality of parity bits is assigned to a least reliable channel of the plurality of information bit channels.

6. The method of claim 3, further comprising:
   applying a parity function to the plurality of payload bits to generate the plurality of parity bits.

7. The method of claim 3, wherein the plurality of parity bits comprises a plurality of cyclic redundancy check (CRC) bits.

8. The method of claim 1, wherein determining the bit vector comprises:
   appending an initial bit to the bit vector, wherein the initial bit comprises an opposite bit value to a default frozen bit value.

9. The method of claim 8, wherein the initial bit indicates a message type associated with the payload.

10. The method of claim 1, wherein determining the bit vector comprises:
    arranging the plurality of payload bits, the plurality of parity bits associated with the plurality of payload bits, the plurality of frozen bits, or a combination thereof so that an initial bit of the bit vector comprises an opposite bit value to a default frozen bit value.

11. A method for wireless communication, comprising:
receiving a polar-encoded codeword, the polar-encoded codeword generated based at least in part on a bit vector comprising a plurality of payload bits of a payload; and
performing a blind decoding process on the polar-encoded codeword, the blind decoding process comprising:
determining a size of the payload based at least in part on at least one log-likelihood ratio (LLR) associated with the bit vector;
decoding the polar-encoded codeword to obtain the bit vector based at least in part on the determined size of the payload; and
parsing the bit vector to obtain the plurality of payload bits based at least in part on the determined size of the payload.

12. The method of claim 11, wherein determining the size of the payload comprises:
performing one or more de-scrambling operations on at least one bit decision for the at least one LLR, wherein each de-scrambling operation utilizes a masking vector corresponding to a payload size.

13. The method of claim 12, further comprising:
identifying a successful de-scrambling operation based at least in part on comparing a plurality of de-scrambled parity bits to a plurality of de-scrambled payload bits; and
determining the size of the payload as the payload size corresponding to the masking vector for the successful de-scrambling operation.

14. The method of claim 12, wherein the de-scrambling operation comprises an inverse exclusive or (XOR) operation.

15. The method of claim 11, wherein the polar-encoded codeword is further generated based at least in part on a plurality of parity bits, the plurality of payload bits and the plurality of parity bits assigned to a plurality of information bit channels, and determining the size of the payload comprises:
performing one or more parity checks on at least one bit decision for the at least one LLR using the plurality of parity bits, wherein a positioning of the plurality of parity bits within the polar-encoded codeword for each parity check indicates a corresponding payload size.

16. The method of claim 15, further comprising:
identifying a successful parity check based at least in part on the plurality of parity bits and the at least one bit decision for the at least one LLR; and
determining the size of the payload as the corresponding payload size indicated by the positioning of the plurality of parity bits resulting in the successful parity check.

17. The method of claim 15, wherein at least one bit of the plurality of parity bits is assigned to a least reliable channel of the plurality of information bit channels.

18. The method of claim 15, wherein the plurality of parity bits comprises a plurality of cyclic redundancy check (CRC) bits.

19. The method of claim 11, wherein determining the size of the payload comprises:
identifying a least reliable bit channel of the polar-encoded codeword with an LLR indicating an opposite bit value to a default frozen bit value; and
determining the size of the payload based at least in part on the identified least reliable bit channel.

20. The method of claim 19, wherein parsing the bit vector comprises:
removing an initial bit corresponding to the LLR indicating the opposite bit value to the default frozen bit value.

21. The method of claim 19, wherein parsing the bit vector comprises:
reordering bits of the bit vector based at least in part on the LLR indicating the opposite bit value to the default frozen bit value.

22. An apparatus for wireless communication, comprising:
a processor;
memory in electronic communication with the processor; and
instructions stored in the memory and executable by the processor to cause the apparatus to:
identify a plurality of payload bits of a payload for encoding;
scramble the plurality of payload bits, a plurality of parity bits associated with the plurality of payload bits, a plurality of frozen bits, or a combination thereof with a masking vector, wherein the masking vector corresponds to a size of the payload;
generate a polar-encoded codeword based at least in part on a bit vector comprising the plurality of payload bits, wherein at least one bit or a bit order of the bit vector is based at least in part on the size of the payload; and
transmit the polar-encoded codeword.

23. The apparatus of claim 22, wherein scrambling the plurality of payload bits, the plurality of parity bits, the plurality of frozen bits, or the combination thereof with the masking vector comprises an exclusive or (XOR) operation.

24. The apparatus of claim 22, wherein the bit vector comprises the plurality of payload bits and the plurality of parity bits associated with the plurality of payload bits.

25. The apparatus of claim 24, wherein the instructions to determine the bit vector are executable by the processor to cause the apparatus to:
position at least one bit of the plurality of parity bits in a lowest index of the bit vector, wherein the plurality of payload bits are positioned in higher indices of the bit vector.

26. The apparatus of claim 25, wherein the instructions to generate the polar-encoded codeword are executable by the processor to cause the apparatus to:
assign the plurality of payload bits and the plurality of parity bits to a plurality of information bit channels of a polar code, wherein the at least one bit of the plurality of parity bits is assigned to a least reliable channel of the plurality of information bit channels.

27. The apparatus of claim 24, wherein the instructions are further executable by the processor to cause the apparatus to:
apply a parity function to the plurality of payload bits to generate the plurality of parity bits.

28. The apparatus of claim 24, wherein the plurality of parity bits comprises a plurality of cyclic redundancy check (CRC) bits.

29. The apparatus of claim 22, wherein the instructions to determine the bit vector are executable by the processor to cause the apparatus to:
append an initial bit to the bit vector, wherein the initial bit comprises an opposite bit value to a default frozen bit value.

30. The apparatus of claim 29, wherein the initial bit indicates a message type associated with the payload.

31. The apparatus of claim 22, wherein the instructions to determine the bit vector are executable by the processor to cause the apparatus to:
arrange the plurality of payload bits, the plurality of parity bits associated with the plurality of payload bits, the plurality of frozen bits, or a combination thereof so that an initial bit of the bit vector comprises an opposite bit value to a default frozen bit value.

32. An apparatus for wireless communication, comprising:
a processor memory in electronic communication with the processor; and
instructions stored in the memory and executable by the processor to cause the apparatus to:
receive a polar-encoded codeword, the polar-encoded codeword generated based at least in part on a bit vector comprising a plurality of payload bits of a payload; and
perform a blind decoding process on the polar-encoded codeword, the instructions stored in the memory for the blind decoding process executable by the processor to cause the apparatus to:
determine a size of the payload based at least in part on at least one log-likelihood ratio (LLR) associated with the bit vector;
decode the polar-encoded codeword to obtain the bit vector based at least in part on the determined size of the payload; and
parse the bit vector to obtain the plurality of payload bits based at least in part on the determined size of the payload.

33. The apparatus of claim 32, wherein the instructions to determine the size of the payload are executable by the processor to cause the apparatus to:
perform one or more de-scrambling operations on at least one bit decision for the at least one LLR, wherein each de-scrambling operation utilizes a masking vector corresponding to a payload size.

34. The apparatus of claim 33, wherein the instructions are further executable by the processor to cause the apparatus to:
identify a successful de-scrambling operation based at least in part on comparing a plurality of de-scrambled parity bits to a plurality of de-scrambled payload bits; and
determine the size of the payload as the payload size corresponding to the masking vector for the successful de-scrambling operation.

35. The apparatus of claim 33, wherein the de-scrambling operation comprises an inverse exclusive or (XOR) operation.

36. The apparatus of claim 32, wherein the instructions to the polar-encoded codeword is further generated based at least in part on a plurality of parity bits, the plurality of payload bits and the plurality of parity bits assigned to a plurality of information bit channels, and determining the size of the payload are executable by the processor to cause the apparatus to:
perform one or more parity checks on at least one bit decision for the at least one LLR using the plurality of parity bits, wherein a positioning of the plurality of parity bits within the polar-encoded codeword for each parity check indicates a corresponding payload size.

37. The apparatus of claim 36, wherein the instructions are further executable by the processor to cause the apparatus to:
identify a successful parity check based at least in part on the plurality of parity bits and the at least one bit decision for the at least one LLR; and
determine the size of the payload as the corresponding payload size indicated by the positioning of the plurality of parity bits resulting in the successful parity check.

38. The apparatus of claim 36, wherein at least one bit of the plurality of parity bits is assigned to a least reliable channel of the plurality of information bit channels.

39. The apparatus of claim 36, wherein the plurality of parity bits comprises a plurality of cyclic redundancy check (CRC) bits.

40. The apparatus of claim 32, wherein the instructions to determine the size of the payload are executable by the processor to cause the apparatus to:
identify a least reliable bit channel of the polar-encoded codeword with an LLR indicating an opposite bit value to a default frozen bit value; and
determine the size of the payload based at least in part on the identified least reliable bit channel.

41. The apparatus of claim 40, wherein the instructions to parse the bit vector are executable by the processor to cause the apparatus to:
remove an initial bit corresponding to the LLR indicating the opposite bit value to the default frozen bit value.

42. The apparatus of claim 40, wherein the instructions to parse the bit vector are executable by the processor to cause the apparatus to:
reorder bits of the bit vector based at least in part on the LLR indicating the opposite bit value to the default frozen bit value.

43. A method for wireless communication, comprising:
identifying a plurality of payload bits of a payload for encoding;
determining a bit vector comprising the plurality of payload bits and a plurality of parity bits associated with the plurality of payload bits, wherein the plurality of parity bits and the plurality of payload bits are positioned at respective indices of the bit vector;
assigning the plurality of payload bits and the plurality of parity bits to a plurality of information bit channels of a polar code, wherein at least one parity bit is assigned to a least reliable channel of the plurality of information bit channels;
generating a polar-encoded codeword based at least in part on the bit vector and the plurality of information bit channels of the polar code; and
transmitting the polar-encoded codeword.

44. The method of claim 43, wherein the plurality of parity bits comprises a plurality of cyclic redundancy check (CRC) bits.

45. An apparatus for wireless communication, comprising:
a processor;
memory in electronic communication with the processor; and
instructions stored in the memory and executable by the processor to cause the apparatus to:
identify a plurality of payload bits of a payload for encoding;
determine a bit vector comprising the plurality of payload bits and a plurality of parity bits associated with the plurality of payload bits, wherein the plurality of parity bits and the plurality of payload bits are positioned at respective indices of the bit vector;
assign the plurality of payload bits and the plurality of parity bits to a plurality of information bit channels of a polar code, wherein at least one parity bit is assigned to a least reliable channel of the plurality of information bit channels;

generate a polar-encoded codeword based at least in part on the bit vector and the plurality of information bit channels of the polar code; and transmit the polar-encoded codeword.

46. The apparatus of claim 45, wherein the plurality of parity bits comprises a plurality of cyclic redundancy check (CRC) bits.

* * * * *